United States Patent
Ross et al.

(10) Patent No.: US 10,228,292 B2
(45) Date of Patent: Mar. 12, 2019

(54) VIRTUAL DATA CENTER ENVIRONMENTAL MONITORING SYSTEM

(71) Applicant: Amazon Technologies, Inc., Seattle, WA (US)

(72) Inventors: Peter George Ross, Olympia, WA (US); Adolfo Bravo Ferreira, Seattle, WA (US); Richard Chadwick Towner, Front Royal, VA (US)

(73) Assignee: Amazon Technologies, Inc., Seattle, WA (US)

( * ) Notice: Subject to any disclaimer, the term of this patent is extended or adjusted under 35 U.S.C. 154(b) by 102 days.

(21) Appl. No.: 15/583,905

(22) Filed: May 1, 2017

(65) Prior Publication Data
US 2017/0234738 A1 Aug. 17, 2017

Related U.S. Application Data

(63) Continuation of application No. 14/284,337, filed on May 21, 2014, now Pat. No. 9,638,583.

(51) Int. Cl.
*G01K 3/14* (2006.01)
*H05K 7/20* (2006.01)
(Continued)

(52) U.S. Cl.
CPC .......... *G01K 3/14* (2013.01); *G05D 23/1917* (2013.01); *G06F 11/301* (2013.01);
(Continued)

(58) Field of Classification Search
CPC .... G01K 3/14; G05D 23/1917; G06F 11/301; G06F 11/3058; G06F 11/3089; G06F 11/3452; H05K 7/20836
See application file for complete search history.

(56) References Cited

U.S. PATENT DOCUMENTS 7,878,008 B1   2/2011  Mateski et al.
7,933,737 B2 *  4/2011  Gross ...................... G01K 7/42
                                                  702/130
(Continued)

FOREIGN PATENT DOCUMENTS

CN      102057367     5/2011
CN      102654301     9/2012
(Continued)

OTHER PUBLICATIONS

Japanese Notice of Refusal and English Translation from Application No. 2016-568935, dated Nov. 14, 2017, Amazon Technologies, Inc., pp. 1-11.

(Continued)

*Primary Examiner* — Marc E Norman
(74) *Attorney, Agent, or Firm* — Robert C. Kowert; Meyertons, Hood, Kivlin, Kowert & Goetzel, P.C.

(57) ABSTRACT

A virtual temperature monitoring system in a data center communicates with servers mounted in racks to receive internal temperature data generated by internal temperature sensors of the servers. The system derives a virtual sensor measurement of external temperatures external to the server, including a portion of a cold aisle that extends proximate to a rack in which the server is mounted, based upon a relationship between the received internal temperature sensors and the external environment. Sensor data from other sensors can be received via a building management system, and building management signals to the building management system can be generated based at least partially on the virtual sensor data. The virtual sensor data can be used to generate a graphical representation of the servers that highlights relative thermal characteristics of the servers based on the virtual external sensor measurements, including heat (Continued)

indices, excursions beyond thresholds, historical excursion histories, etc.

20 Claims, 16 Drawing Sheets

(51) Int. Cl.
*G05D 23/19* (2006.01)
*G06F 11/30* (2006.01)
*G06F 11/34* (2006.01)

(52) U.S. Cl.
CPC ...... *G06F 11/3058* (2013.01); *G06F 11/3089* (2013.01); *G06F 11/3452* (2013.01); *H05K 7/20836* (2013.01)

(56) References Cited

U.S. PATENT DOCUMENTS

| | | | |
|---|---|---|---|
| 8,311,764 | B1 | 11/2012 | Robillard et al. |
| 9,638,583 | B2* | 5/2017 | Ross ......................... G01K 3/14 |
| 2002/0149911 | A1 | 10/2002 | Bishop et al. |
| 2006/0047808 | A1 | 3/2006 | Sharma et al. |
| 2009/0234613 | A1 | 9/2009 | Brey et al. |
| 2009/0271049 | A1* | 10/2009 | Kinney .............. G05D 23/1917 700/300 |
| 2010/0217454 | A1 | 8/2010 | Spiers et al. |
| 2010/0286843 | A1 | 11/2010 | Lyon |
| 2011/0107332 | A1 | 5/2011 | Bash |
| 2012/0185202 | A1* | 7/2012 | Aljabari .................... G01K 1/20 702/130 |
| 2012/0224976 | A1 | 9/2012 | Nagamatsu et al. |
| 2013/0212443 | A1 | 8/2013 | Ikegami |
| 2014/0150480 | A1 | 6/2014 | Kodama |

FOREIGN PATENT DOCUMENTS

| | | |
|---|---|---|
| CN | 103189849 | 7/2013 |
| JP | 2002108483 | 4/2002 |
| WO | 2009126154 | 10/2009 |

OTHER PUBLICATIONS

Office Action from Chinese Application No. 201580027405.7, dated Feb. 27, 2018, English translation and Chinese Version), pp. 1-16.
Data Center Knowledge,"How a Robot a Can Simply Data Center Management", Industry Perspectives, Aug. 26, 2013, pp. 1-4.
Intel, "Intel DCM: Energy Director", downloaded Mar. 5, 2014, pp. 1-4.
Datacenter Dynamics, "Vigilent and Schneider Want to Stop Energy Wasting in Data Centers", Nick Booth, May 20, 2014, pp. 1-3.
International Search Report and Written Opinion for PCT/US2015/032022, dated Sep. 7, 2015, Amazon Technologies, Inc., pp. 1-13.
Office Action from Canadian Application No. 2,949,695, (Amazon Technologies, Inc.), dated Aug. 7, 2018, pp. 1-4.

* cited by examiner

VIRTUAL DATA CENTER ENVIRONMENTAL MONITORING SYSTEM

This application is a continuation of U.S. patent application Ser. No. 14/284,337, filed May 21, 2014, now U.S. Pat. No. 9,638,583, which is hereby incorporated by reference herein in its entirety.

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack computing system. Some known rack computing systems include 40 such rack-mounted components and such rack computing systems will therefore generate as much as 10 kilowatts of waste heat. Moreover, some known data centers include a plurality of such rack computing systems.

Some known data centers include methods and apparatus that facilitate waste heat removal from rack systems. Some waste heat removal systems remove waste heat from data centers by transferring waste heat to flows of air ("exhaust air"), which are then used to transport the waste heat to an environment external to the data center. Such an environment can include an ambient environment. Such methods and apparatus can include directing cooling air into an intake side of a rack in which computer systems are installed, through an interior of the rack so that the cooling air removes heat from heat-producing components of the computer systems, and is discharged from an opposite "exhaust end" of the rack as exhaust air to remove the heat from the rack.

In some cases, exhaust air can pass back from the exhaust end of the rack to the intake end of the rack. Such "recirculation" of exhaust air may have a reduced capacity to remove heat relative to non-recirculated cooling air, and recirculated exhaust air on an intake end of a rack may be recirculated through the rack. Such recirculation of exhaust air to the intake end can establish a feedback loop which can lead to reduced heat removal from one or more computer systems in the rack, waste heat buildup in the rack, overheating, damage to computing components, etc. Such results can result in detrimental effects on computing capabilities of a data center.

In some cases, environmental conditions in a data center can deviate from normal operating conditions. Such deviations can be caused by various factors. For example, broken air moving devices, air intake debris obstructions, etc. in servers can restrict the flow of cooling air to remove heat from the server, thus posing a risk of thermal damage to a server. In addition, where cooling air is provided to a computer room via one or more air handling systems, a negative pressure differential across the air handling systems, including a negative pressure differential between an air cooling system and an underfloor plenum supplying the cooling air to the computer room, can result in certain computer systems being starved of cooling air, including computer systems mounted on top of racks, etc. Furthermore, where the temperature and relative humidity in a computer room, which can be represented by a heat index value, exceeds a threshold, various components in a server can incur damage. In another example, temperatures in parts of a computer room may drop below normal where excess cooling is being provided, which may represent a waste of cooling resources.

In some cases, a data center can include environmental sensors which can monitor one or more environmental characteristics, including one or more of temperature, air pressure, relative humidity, some combination thereof, or the like. Environmental sensors can be positioned in various regions in a data center and can provide sensor data indicating environmental data for various servers located in the regions. A given region may include various servers, which may be mounted in one or more various racks. An environmental sensor in a region of servers may generate environmental data for the region that is associated with each of the servers in the region.

As a result, where a common set of environmental data may be associated with multiple servers in a data center region, the generated sensor data may not account for individual variations in environmental conditions at an individual rack level, server level, etc. within the region. For example, where a region of a data center includes a cold aisle, through which cooling air is circulated and along which two rows of racks extend along opposite sides of the aisle, a temperature sensor mounted in the aisle may generate aisle temperature data for each of the servers mounted in the rows of racks and may not account for individual temperatures of portions of the aisle proximate to each of the individual servers. Mounting additional environmental sensors in the data center region, for example mounting individual environmental sensors proximate to each of the servers in each of the racks in a given region, may be time consuming and costly.

Figure 1:
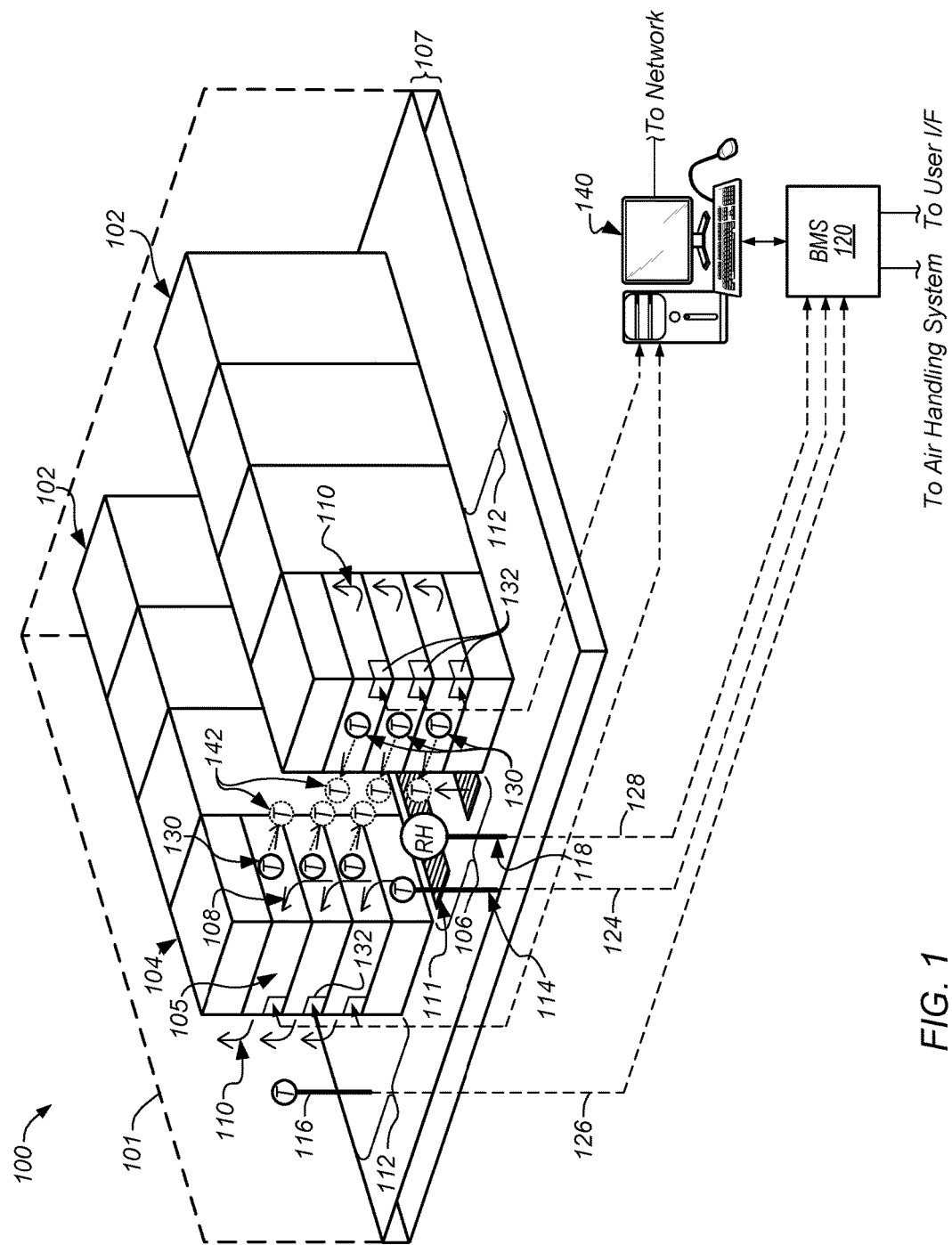
FIG. 1 is a schematic diagram illustrating a perspective view of a data center that includes a virtual monitoring system, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of an environmental monitoring system for a data center are disclosed. According to one embodiment, a data center includes computer systems supported in one or more racks, a cold aisle, a hot aisle, and a virtual monitoring device. Each computer system includes an internal computer temperature sensor that generates internal temperature sensor data indicating an internal environment temperature of the respective computer system. The cold aisle extends adjacent to a front end of each of the racks and supplies cooling air to respective internal environments of each of the computer systems. The cold aisle includes external environments that each correspond to a separate computer system. The virtual monitoring system is communicatively coupled to each of the computer systems and generates virtual external temperature sensor measurement for each of the external environments. Each instance of virtual external temperature sensor measurement indicates a virtual sensor measurement of the temperature of a separate external environment, based at least in part upon the internal temperature sensor data received from the corresponding computer system and a relationship between the internal temperature of the computer system and the external environment.

According to one embodiment, a virtual monitoring system includes a worker module and a processor module. The worker module communicates receives an internal sensor measurement from a remote computer system. The internal sensor measurement is generated by an internal sensor of the computer system and indicates an internal temperature of the computer system. The processor module derives a virtual external temperature sensor measurement of the temperature of an external environment that is external to the remote computer system. The derivation is based at least in part upon the received internal temperature sensor measurement and a relationship between the internal temperature and the external environment.

According to one embodiment, a non-transitory computer readable medium storing a program of instructions that, when executed by a computer system, cause the computer system to communicate with a portion of a remote service to receive an internal temperature sensor measurement and derive a virtual external temperature sensor measurement based at least in part upon the internal temperature sensor measurement and a relationship between the internal temperature and the external environment. The internal temperature sensor measurement is generated by an internal sensor of the remote computer system and indicates an internal temperature of the remote computer system. The virtual external temperature sensor measurement is a virtual sensor measurement of an external temperature of an environment external to the remote computer system.

As used herein, an "aisle" means a space next to one or more racks.

As used herein, "computing" includes any operations that can be performed by a computer, such as computation, data storage, data retrieval, or communications.

As used herein, "computer room" means a room of a building in which computer systems, such as rack-mounted servers, are operated.

As used herein, "computer system", also referred to herein as a "computing device", includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, a "module" is a component or a combination of components physically coupled to one another. A module may include functional elements and systems, such as computer systems, racks, blowers, ducts, power distribution units, fire suppression systems, and control systems, as well as structural elements, such a frame, housing, structure, container, etc. In some embodiments, a module is prefabricated at a location off-site from a data center.

As used herein, a "rack" means a rack, container, frame, or other element or combination of elements that can contain or physically support one or more electrical systems, such as servers.

As used herein, "room" means a room or a space of a structure. A "computer room" means a room in which computer systems, such as rack-mounted servers, are operated.

As used herein, "shelf" means any element or combination of elements on which an object can be rested or mounted. A shelf may include, for example, a plate, a sheet, a tray, a disc, a block, a grid, a box or a set of support rails. A shelf may be rectangular, square, round, or another shape. In some embodiments, a shelf may include one or more rails.

As used herein, a "space" means a space, area or volume.

FIG. 1 is a schematic diagram illustrating a perspective view of a data center that includes a virtual environmental monitoring system, according to some embodiments.

Data center 100 includes a computer room 101 including rows 102 of racks 104 in which computer systems 105 are installed, underfloor cooling air plenum 107, cold aisle 106, hot aisles 112, and external sensor devices 114, 116, 118. Data center 100 further includes Building Management System (BMS) 120 and virtual monitoring system 140.

For purposes of clarity, computer systems 105, and one or more components included therein, are illustrated for two of the eight racks 104 illustrated in FIG. 1. It will be understood that some or all of the racks 104 in a data center 100 can include various numbers of computer systems 105 installed therein, and data center 100 can include various numbers of computer rooms 101, various numbers of rows 102, and various numbers of racks 104.

In some embodiments, cooling air is circulated through regions of a data center to cool heat-producing components in computer systems installed in data center racks. Racks can be arranged into rows, where front, or "inlet" ends of racks face into common aisles, referred to hereinafter as "cold aisles", into which cooling air is supplied, where the computer systems installed in the racks receive cooling air from the cold aisle via inlet ends of the computer systems that are proximate to the inlet ends of the racks. In the illustrated embodiment, for example, rows 102 of racks 104 can be arranged so that the computer systems 105 installed in the racks 104 face, at respective inlet ends, into a cold aisle 106 and receive cooling air from the cold aisle 106 via inlet ends of the respective computer systems 105 that face into the cold aisle 106. In some embodiments, including the illustrated embodiment, cooling air 108 can be supplied into the cold aisle 106 via an underfloor plenum 107 through which cooling air is circulated and vents 111 in the floor of the cold aisle 106 that can direct cooling air 108 from the plenum 107 into the cold aisle 106. In some embodiments, the cooling air 108 is supplied to the plenum 107 via an air handling system (not shown in FIG. 1), which can include a chiller-less air cooling system. In some embodiments, an air handling system includes one or more air moving devices, mechanical cooling systems, evaporative cooling systems, exhaust air recirculation systems, some combination thereof, or the like.

In some embodiments, cooling air 108 received into computer systems 105 passes across one or more heat-producing components in the computer systems 105 and removes heat from such components. The air that has removed such heat, referred to hereinafter as exhaust air 110, can be discharged from a computer system 105 into an exhaust space, where the exhaust air 110 can be removed from computer room 101 via the exhaust space. In some embodiments, the exhaust space is an aisle, referred to hereinafter as a "hot aisle" 112, that extends along one or more rows 102 of racks 104 on an opposite side of at least one row 102 from a cold aisle 106.

In some embodiments, various environmental conditions in a data center are monitored via one or more sensor devices. The sensor devices can measure one or more environmental conditions, including temperature, relative humidity, air pressure, wet-bulb temperature, etc., and sensor data can be generated by the various sensor devices, where the sensor data indicates the conditions measured by the respective sensor devices. Sensor devices can be placed throughout various regions of a data center to measure various conditions in various locations in the data center. In the illustrated embodiment of FIG. 1, for example, computer room 101 of data center 100 includes temperature sensor devices 114, 116 and a relative humidity sensor device 118. Sensor devices 114 and 118 are positioned proximate to cold aisle 106, where temperature sensor device 114 can measure an air temperature of at least some cooling air 108 in the cold aisle 106 and relative humidity sensor device 118 can measure a relative humidity of at least some cooling air 108 in the cold aisle 106. Temperature sensor 116 can measure an air temperature of at least some of the exhaust air 110 in hot aisle 112.

In some embodiments, sensor devices are communicatively coupled to one or more computer systems via one or more communication pathways. Such communication pathways can, in some embodiments, include one or more communication networks, and such one or more computer systems can include one or more remote computer systems communicatively coupled to the same one or more communication networks, such that the remote computer systems are communicatively coupled to receive sensor data from sensor devices 114, 116, 118 via a communication network. In some embodiments, a remote computer system includes a management system, including one or more BMS devices 120. Sensor data, which can include measurements of temperature, relative humidity, etc., can be received at the BMS from the various sensor devices.

In some embodiments, sensor data can be processed to determine environmental conditions associated with various regions of a computer room 101. Temperature measurements received from sensor device 114 that is proximate to cold aisle 106 can be used to determine the air temperature of cooling air 108 in cold aisle 106. The determined air temperatures can be compared against one or more threshold temperature values to determine a present operating state of the regions of the data center. For example, an air temperature measurement from sensor device 114 can be compared against multiple thresholds associated with present operating states including "normal state," "warning state", "critical state", "fatal state", etc. Where a temperature measurement is within a range of temperature values established by one or more sets of threshold values, where the range is associated with a present operating state, the region of the data center with which the temperature measurement is associated can be determined to be in that present operating state. For example, where a temperature measurement at sensor device 114 indicates an air temperature of cooling air 108 proximate to the sensor device 114 that exceeds a threshold value associated with a critical state and does not exceed another threshold associated with a critical state, the cold aisle 106 can be determined to be in a "warning" operating state. Various operating states can be associated with various characteristics, including threshold operating temperatures of the computer systems 105, data center operator safety requirements, etc. For example, a "fatal" operating state may be associated with a state where air temperatures in cold aisle 106 exceed the maximum safe operating temperature of computer systems 105, such that the computer systems are at imminent risk of thermal damage to various internal components.

In some embodiments, a signal can be generated by one or more systems based at least in part upon the determined operating state of one or more regions of a data center. The signal can include a signal to one or more operators of the data center and can include instructions for one or more various operator actions to be taken with regard to the determined present operating state. Operator actions can include inspections, maintenance, etc. with regard to various components in the various regions of the data center. In addition, one or more elements of data center 100 can perform various operations based on determinations made in response to received sensor data. For example, where sensor data from temperature sensor 114 indicates a temperature associated with cold aisle 106 that exceeds a threshold, where a particular present operating state is associated with cold aisle 106, the BMS 120 can command one or more portions of an air handling system, including one or more air moving devices, air cooling systems, etc. to adjust the cooling capacity of cooling air provided to the room 101, including increasing cooling of the cooling air by one or more air cooling systems, increasing a flow rate of cooling air supplied to the room, some combination thereof, or the like.

In some embodiments, environmental conditions in a region of a data center can vary throughout the region, so that measuring environmental conditions with a sensor device associated with a data center region, mounted in the region, etc. may produce data that is associated with conditions proximate to the sensor device and does not indicate variations in conditions throughout the region. For example, the temperature in regions of cold aisle 106 that are proximate to corresponding computer systems 105 in racks 104, including a localized environment of the cold aisle 106 above a proximate floor vent 111 and at a common elevation with the respective computer system 105, can vary between respective regions of cold aisle 106. Such variation may not be apparent in measurements by sensor device 114, particularly with regard to regions of cold aisle 106 that are not proximate to sensor device 114. As a result, where air temperatures proximate to sensor device 114 correspond to a normal operating state, but air temperatures of some regions in the cold aisle 106 that are not proximate to sensor device 114 correspond to a critical operating state, the sensor device 114 may generate sensor data that cannot be processed to determine the presence of a critical operating state at one or more regions in the cold aisle 106. Additional sensor devices 114 can be mounted throughout the cold aisle 106 to provide additional granularity of temperature data associated with various regions of the cold aisle 106, including mounting a sensor device on one or more racks 104, mounting a sensor device proximate to each of the computer systems 105. Mounting such additional sensor devices can require extensive expenditure of time and resources, including monetary cost for the additional sensors, communication and power connections required for each sensor, space occupied by each sensor device in the computer room 101, some combination thereof, or the like.

In some embodiments, computer systems include internal temperature sensors. Such temperature sensors can measure temperatures associated with various regions of the computer system. An internal temperature sensor of a computer system can measure temperature proximate to certain components in the internal environment of the computer system. Such internal temperature measurements by the internal sensors of the computer system may be provided to one or more systems in the computer system, including a baseboard management controller device. Such internal sensor measurements generated by the internal sensor may be utilized by the computer system to regulate various aspects of the computer system, including internal air moving device speed, processor activity, etc.

In the illustrated embodiment, for example, each illustrated computer system 105 installed in racks 104 includes at least one internal temperature sensor 130. Each internal temperature sensor 130 in a computer system 105 can measure an internal temperature of one or more regions of the interior environment of the respective computer system 105. Each illustrated computer system 105 includes a module 132 that can receive internal temperature measurements by one or more internal sensors, including internal temperature sensors 130, of the respective computer system 105. In some embodiments, module 132 includes a baseboard management controller (BMC). Module 132 can be implemented by one or more portions of one or more computer systems 105. In some embodiments, module 132 communicates with a BMC of a computer system 105 to receive internal temperature measurements. Module 132 can generate a signal indicating a received internal temperature measurement to one or more remote destinations, including system 140.

In some embodiments, internal temperature sensor measurements by internal temperature sensors of one or more computer systems in a data center can be communicated to one or more computer systems which can process the internal temperature sensor measurements to determine a temperature of an environment that is external to the computer system. Such a determination can include deriving a virtual sensor measurement based at least in part upon the internal temperature sensor measurement of one or more internal sensors and a relationship, also referred to hereinafter as an "offset", between internal sensor measurements and the temperature of the external environment. The offset can be predetermined for one or more particular computer systems and received at the virtual monitoring system from a remote source. The environment that is external to the computer system can include an environment that is proximate and corresponding to the computer system in a data center.

In the illustrated embodiment, for example, a virtual monitoring system 140 is communicatively coupled to modules 132 of each of the computer systems 105 in computer room 101, where the system 140 can communicate with each module 132 of each computer system 105 to access internal sensor temperature measurements generated by one or more internal sensors 130 in the respective computer systems 105. The virtual monitoring system 140 can process an internal sensor temperature measurement of a given internal sensor 130 of a given computer system 105 to derive a virtual sensor measurement 142 of a particular environment of the cold aisle 106 that is proximate to the inlet end of the given computer system 105. Such a particular environment, being proximate to a particular end of a particular computer system 105 and being virtually monitored via an internal sensor of the particular computer system 105, can be understood to "correspond" to the computer system. As discussed further below, a virtual sensor measurement of an external environment, which can include a region of the cold aisle 106 that is proximate to and corresponds to a given computer system, including a region of the cold aisle that is adjacent to the inlet end of the computer system 105 as illustrated, can be derived for each of the computer systems 105 based upon internal sensor temperature measurements received from each of the computer systems 105.

Where a virtual sensor measurement can be derived for multiple regions of a data center computer room, including multiple regions of a cold aisle 106 that each correspond to a separate and particular computer system 105 facing the cold aisle 106, monitoring system 140 can enable monitoring of cold aisle environmental conditions at a rack 104 level in the cold aisle, at a computer system 105 level etc., through the utilization of temperature sensors 130 that are utilized to monitor internal environments of the computer systems 105, where a requirement for multiple temperature sensors 114, 116 external to the computer systems 105 can be partially or entirely mitigated. Multiple separate sensor measurements associated with multiple separate regions of a cold aisle 106 can be derived, independently of mounting and monitoring multiple external sensor devices 114 in the cold aisle 106, using internal sensors 130 utilized by the computer systems 105 to monitor internal conditions. As a result, granularity of environmental monitoring in one or more regions of a data center 100 can be augmented, where environmental conditions can be monitored at a computer system level, rack level, etc.

In some embodiments, environmental sensor measurements from various additional external sensors can be processed in combination with derived virtual external sensor measurements to monitor one or more additional environmental conditions in various regions of the computer room. Such additional data can be received at monitoring system 140 from various external sources, including a BMS 120. For example, where BMS 120 receives relative humidity measurements corresponding to cold aisle 106 from sensor device 118, the relative humidity measurements can be received at system 140 from BMS 120, and the relative humidity measurement for some or all of the cold aisle 106 can be utilized, in combination with the derived virtual sensor temperature measurements corresponding to each of the multiple "environments" of the cold aisle that each correspond to particular proximate computer systems 105, to determine a heat index of air in each of the environments.

In some embodiments, temperature measurements of an environment that is external to a corresponding computer system and proximate to the computer system can be used to determine various conditions of cooling air received into the computer system. For example, derived virtual external sensor measurements of air temperature of an external environment in cold aisle 106 that corresponds to a given computer system 105 can indicate an air temperature of cooling air 108 received into the computer system 105. The derived air temperature, in combination with relative humidity sensor data associated with a region of the data center that includes the particular external environment, can be used to determine a wet bulb temperature, dry bulb temperature, etc. of cooling air 108 received into a particular computer system 105 in computer room 101. Such measurements can be compared with various threshold values to determine a present operating state of the computer system 105. In some embodiments, derived air temperatures associated with multiple computer systems 105 are collectively used to determine a heat index value for one or more particular regions ion a data center. For example, derived air temperatures from multiple computer systems 105 in a rack 104 can be processed, and one or more of the minimum, maximum, and average derived temperatures from the multiple computer systems 105 can be determined. In some embodiments, one or more of the processed air temperatures for the multiple computer systems, including the maximum air temperature for the computer systems 105 in the rack 104, can be used to determine a heat index value associated with the rack 104.

In some embodiments, internal sensor temperature measurements from various internal sensors 130 of various computer systems 105 can be used to derive virtual sensor temperature measurements of various external environments corresponding to respective computer systems 105. For example, where a computer system 105 mounted in a rack 104 faces cold aisle 106 on an inlet end of the computer system that receives cooling air 108 from the cold aisle 106, and further faces a hot aisle 112 on an exhaust end of the computer system that discharges exhaust air 110 into the hot aisle 112, internal sensor temperature measurements of one or more internal sensors 130 of the computer system, received at a monitoring system 140 via the module 132 of the computer system 105, can be used to derive a virtual sensor temperature measurement of a region of the cold aisle 106 that is proximate to the inlet end of the computer system, which can be used to derive the temperature of cooling air received into the computer system 105, and can also be used to derive a virtual sensor temperature measurement of a region of the hot aisle 112 that is proximate to the exhaust end of the computer system, which can be used to derive the temperature of exhaust air discharged from the computer system 105.

Where such derived temperature, relative humidity, heat indices, etc. of external environments corresponding to various particular computer systems exceeds one or more thresholds, the monitoring system 140 can respond by generating various output signals. Output signals can include action requests, messages to various users, various building management signals to BMS 120 to adjust various data center components, including regions of an air handling system, etc. Thresholds can include high temperature thresholds, low temperature thresholds, high heat index thresholds, low heat index thresholds, high relative humidity thresholds, low relative humidity thresholds, etc.

In some embodiments, virtual external temperature sensor measurements of external environments corresponding to separate various computer systems 105 installed in various racks 104 can be used to monitor regions of a data center 100 for recirculation of air through one or more computer systems. Exhaust air 110 can, in some embodiments, recirculate back from hot aisle 112 to cold aisle 106. Such recirculation can be based at least in part upon leakage of the exhaust air 110 through one or more pathways back to cold aisle 106. For example, in some embodiments the air pressure in the hot aisle 112 may be elevated above the air pressure in the cold aisle 106, where a pressure gradient from the hot aisle 112 to the cold aisle 106 may induce exhaust air 110 to flow to the cold aisle 106 in the presence of an unobstructed pathway from hot aisle 112 to cold aisle 106. In another example, the air pressure in the cold aisle 106 may be depressed below the air pressure in the hot aisle 112, where the cold aisle 106 air pressure is insufficient to enable cooling air to reach one or more computer systems 105 in various locations in a rack 104, including computer systems 105 mounted in a top position in a rack 104. Recirculation can, in some embodiments, manifest as an elevated temperature of an external environment corresponding to a computer system 105, where the external environment is proximate to an inlet end of the computer system 105 in the cold aisle 106 and the elevated temperature is significantly elevated with regard to other proximate computer systems 105 in the computer room 101.

In some embodiments, system 140 can monitor derived virtual sensor temperature measurements of each of the external environments proximate to each of the computer systems 105 in a rack 104, based at least in part upon determining the highest and lowest respective external environment temperatures of the external environments corresponding to computer systems 105 in a given rack 104 and comparing a temperature difference between the highest and lowest temperatures with one or more predetermined threshold temperatures difference magnitudes. Where the temperature difference of the measured highest and lowest external environment temperatures corresponding to computer systems 105 in the rack 104 exceeds a threshold, system 140 can determine that recirculation is presently occurring relative to at least the rack 104. The system 140 can respond to such a determination by generating an alarm signal for a data center operator, generating a message that indicates at least the rack for which recirculation is determined to be occurring, etc.

In some embodiments, various derived virtual sensor measurements of external environments in the data center 100 can be utilized to generate one or more user displays providing information related to conditions of the various external environments, corresponding computer systems 105, etc. Such displays can include one or more graphical representations of the computer room 101, including graphical representations of the computer systems 105 in the room 101. Such graphical representations can include highlighted representations of the computer systems, where the variable highlightings of each computer system are based at least in part upon one or more derived virtual sensor measurements of one or more external environments proximate to and corresponding to the respective computer system 105.

Figure 2:
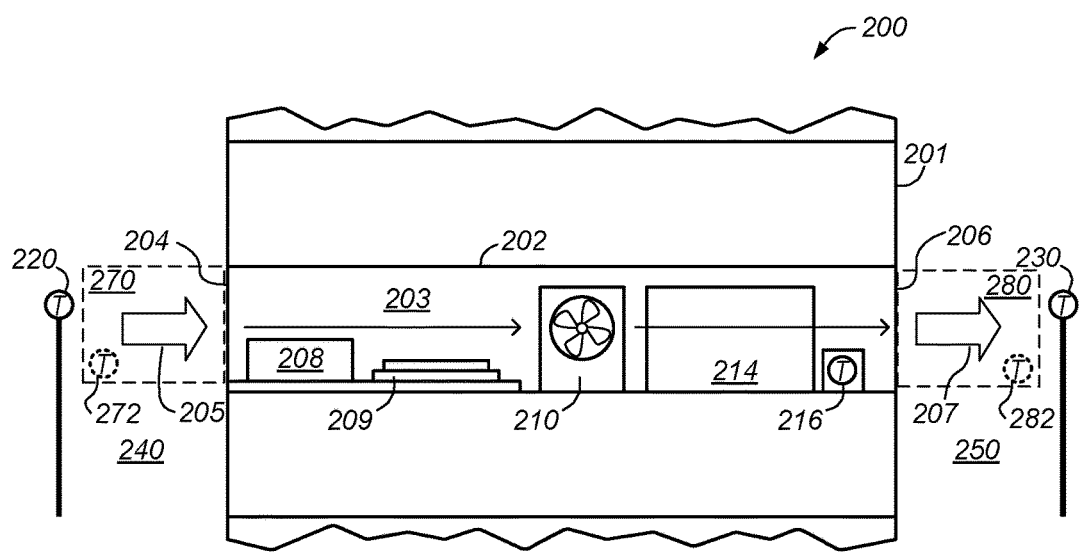
FIG. 2 is a schematic diagram illustrating a side view of a rack-mounted computer system including various components, internal environmental sensors, and externally-mounted environmental sensors, according to some embodiments.

FIG. 2 is a schematic diagram illustrating a side view of a rack-mounted computer system including various components, internal environmental sensors, and externally-mounted environmental sensors, according to some embodiments. In some embodiments, rack computing system 200 that comprises a computer system 202 comprises the rack 104 comprising at least one computer system 105 as illustrated and described above with reference to FIG. 1.

Rack computing system 200 can include one or more computer systems 202 installed in a rack 201. Computer system 202 faces a cold aisle 240 on an inlet end 204 of the computer system 202, where cooling air 205 is received into the internal environment 203 of the computer system 202 via one or more regions of the inlet end 204, which can include one or more inlet vents (not shown in FIG. 2). Cooling air 205 can pass through the internal environment and in heat transfer communication with one or more heat-producing components in the internal environment 203 of the computer system, where the cooling air 205 removes at least some heat from the heat-producing components. For example, the illustrated computer system 202 can include a central processing unit (CPU) device 209 and a mass storage device 214, which can include a hard disk drive (HDD), which each can include heat-producing components that generate waste heat. Cooling air 205 can pass through the internal environment 203 to remove heat from one or more of the devices 209, 214, etc. A computer system 202 can include one or more air moving devices 210, which can include one or more fans, blowers, or the like, that can induce airflow through the internal environments 203 of the computer system 202 to cause the cooling air 205 to pass from the inlet end 204 to an exhaust end 206 of the computer system 202. Cooling air 205 which has passed through the internal environment 203 to the exhaust end 206, which can include exhaust air 207 which has removed heat from at least one heat-producing component in computer system 202, can be discharged from the computer system 202 and into a hot aisle 250, which the computer system 202 faces on the exhaust end 206.

In some embodiments, a computer system 202 includes one or more internal sensor devices which measure one or more environmental conditions of one or more regions of internal environment 203. For example, computer system 202 illustrated in FIG. 2 includes an internal temperature sensor 216 that can measure an internal temperature of one or more regions of the internal environment 203. Internal sensor temperature measurements generated by sensor device 216 can be communicated to a BMC device 208 included in the computer system 202. BMC device 208 can, in some embodiments, store at least a portion of measurements generated by one or more internal sensors of the computer system 202, including sensor device 216.

In some embodiments, sensor data communicated to the BMC can be communicated to one or more remote computer systems, including a remote virtual monitoring system that processes internal sensor temperature measurements by the internal sensor device 216 to derive a virtual sensor temperature measurement of one or more regions of one or more external environments that are external to the computer system. A virtual sensor measurement can include a derived measurement of temperature by a virtual sensor at a location where a physical sensor is absent.

In some embodiments, an external environment for which a virtual sensor measurement can be derived may be remote from one or more external sensors mounted in one or more regions of a data center. For example, in the illustrated embodiment, external environment 270 of cold aisle 240 and external environment 280 of hot aisle 250 may be remote from external sensor devices 220, 230 in the respective aisles 240, 250. As a result, sensor temperature measurements generated by sensor device 220 may be inaccurate with regard to the temperature of cooling air 205 in environment 270. Similarly, sensor temperature measurements generated by sensor 230 may be inaccurate with regard to the temperature of exhaust air 207 in environment 280. Such sensors 220, 230 may be arranged in the aisles to provide temperature measurements for a region that is proximate to multiple computer systems 202, and mounting a sensor in each external environment 270, 280 corresponding to each of the computer systems 202 may require multiple such sensor devices.

In some embodiments, a derived virtual sensor measurement for a given external environment corresponding to one or more computer systems enables a temperature measurement of the external environment independently of requiring a physical sensor device to be mounted proximate to the external environment. In some embodiments, one or more regions of environments external to a computer system may be proximate to and correspond to the computer system, where a virtual sensor measurement of one or more environmental conditions associated with the one or more external environments can be derived based at least in part upon an internal sensor measurement of an internal sensor of the computer system. In the illustrated embodiment, for example, cold aisle 240 includes an external environment 270 that is external to computer system 202 and proximate to the inlet end 204 of the computer system, and hot aisle 250 includes an external environment 280 that is external to computer system 202 and proximate to the exhaust end of the computer system. Such external environments 270 may be understood to be corresponding to the computer system 202. For example, a temperature measurement in environment 270 may correspond to a temperature of cooling air 205 received into the computer system 202, and a temperature measurement in environment 280 may correspond to a temperature of exhaust air 207 discharged from the computer system 202.

In some embodiments, computer system 202 includes an internal temperature sensor 216, and internal sensor temperature measurements generated by sensor 216, and communicated via BMC 208, can be processed to derive a virtual sensor 272 measurement of temperature of cooling air 205 in environment 270 and can be used to derive a virtual sensor 282 measurement of temperature of exhaust air 207 in environment 280.

Figure 3:
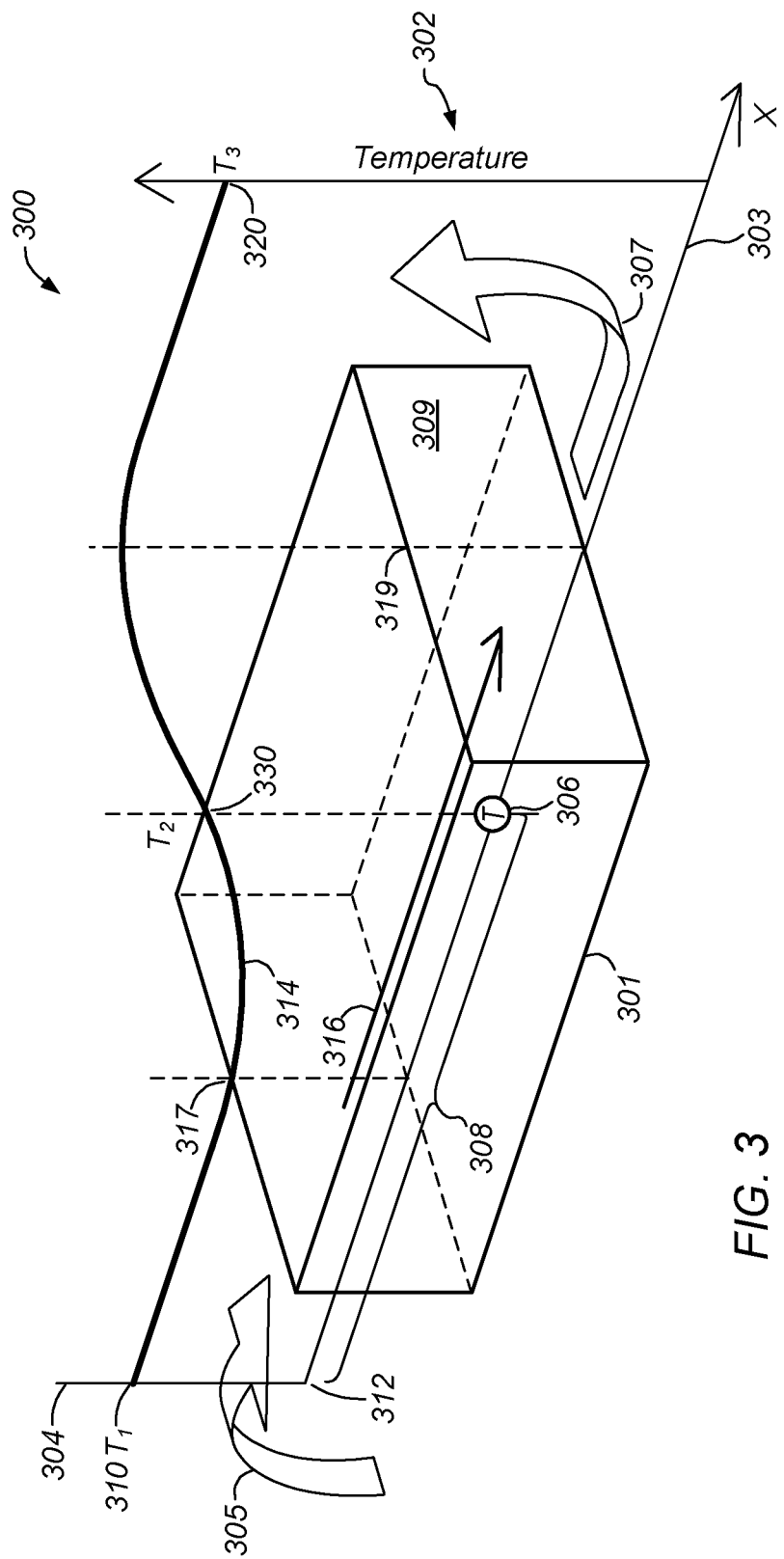
FIG. 3 is a diagram illustrating a relationship between local temperature measurements and location in a data center region, according to some embodiments.

FIG. 3 is a diagram illustrating a relationship between local temperature measurements and location in a data center region, according to some embodiments.

Data center region 300 includes a computer system 301 and a representation 302 of a relationship between air temperature and a location in the data center region relative to an internal temperature sensor 306 mounted in an interior environment of the computer system 301. In some embodiments, computer system 301 and sensor 306 comprise the respective computer system 105 and sensor 130 illustrated and described above with reference to FIG. 1.

In some embodiments, a virtual sensor measurement of an environmental condition in an environment that is external from an environment in which a physical sensor generates an internal sensor measurement can be derived based at least in part upon a relationship between the internal sensor measurement and the external environment. In some embodiments, the relationship, also referred to hereinafter as an "offset", includes one or more relationships between the temperature of an environment, a location of the environment relative to the physical sensor generating the internal sensor measurement, temperature measurement by a sensor device generating an internal sensor measurement, cooling air 305 flow rate, internal computing activity, some combination thereof, or the like.

In the illustrated embodiment of FIG. 3, for example, where an airflow of cooling air 305 enters a computer system 301 at an inlet end 317 and passes in an internal airflow 316 through the interior 309 of the computer system 301, removes heat from one or more heat-producing components in the internal environment 309, and exits the computer system 301 as exhaust air 307 via exhaust end 319, a relationship 302 may describe the variation 314 of temperature 304 of the airflow 316 based on location 303 of the airflow as the airflow 316 passes from an external environment proximate to the inlet end 317 to another external environment proximate to the exhaust end 319 via the internal environment of the computer system 301. As the illustrated relationship 302 shows, cooling air in a location 312 in the external environment proximate to the inlet end of the computer system 301 may have an initial temperature 310. As the cooling air 305 passes in an internal airflow 316 through the computer system 301 internal environment 309 from the inlet end 317, the temperature of the airflow 316 can increase from the initial temperature 310 at the inlet end to another temperature 320 at the exhaust end 319. Internal sensor 306 can measure the temperature 330 of the airflow 316 in at least a region of the internal environment, including a local temperature of the internal environment at a location in the internal environment that is proximate to the sensor 306.

In some embodiments, the variation 314 of temperature of the airflow 316 with location relative to at least sensor 306 can be determined based at least in part upon tracking measurements of temperature by sensor devices at various locations in the data center over time. For example, in some embodiments, the cooling air temperature 310 can be measured at location 312 by an external sensor device mounted proximate to the location 312, and the variations 314 of temperature 310 and the temperature measurement 316 by sensor 306 can be tracked over time. Various condition variables can be adjusted over time, including computing activity of one or more components in the computer system 301 internal environment 309, airflow 316 rate, etc., and the relative changes of temperature measurements at certain locations subsequent to the adjustments can be analyzed to determine the relationship 302.

In some embodiments, the relationship 302 that is determined based at least in part upon tracking variations 314 of temperature measurements at various locations (e.g., by a sensor mounted at location 312, by sensor 306, etc.) can be used to derive a virtual sensor measurement of temperature at a particular location based at least in part upon an internal sensor measurement by sensor 306. For example, a virtual sensor measurement of the cooling air temperature 310 at location 312 external to computer system 301 can be derived based at least in part upon a temperature measurement 330 by sensor 306 and a determined relationship 302 between temperature 310, measured temperature 330, and location 303 in the data center 300. In some embodiments, the displacement 308 between the sensor 306 and the particular location can be considered as a variable to derive the virtual sensor measurement at a particular location that is a certain displacement 308 from the sensor 306.

Figure 4:
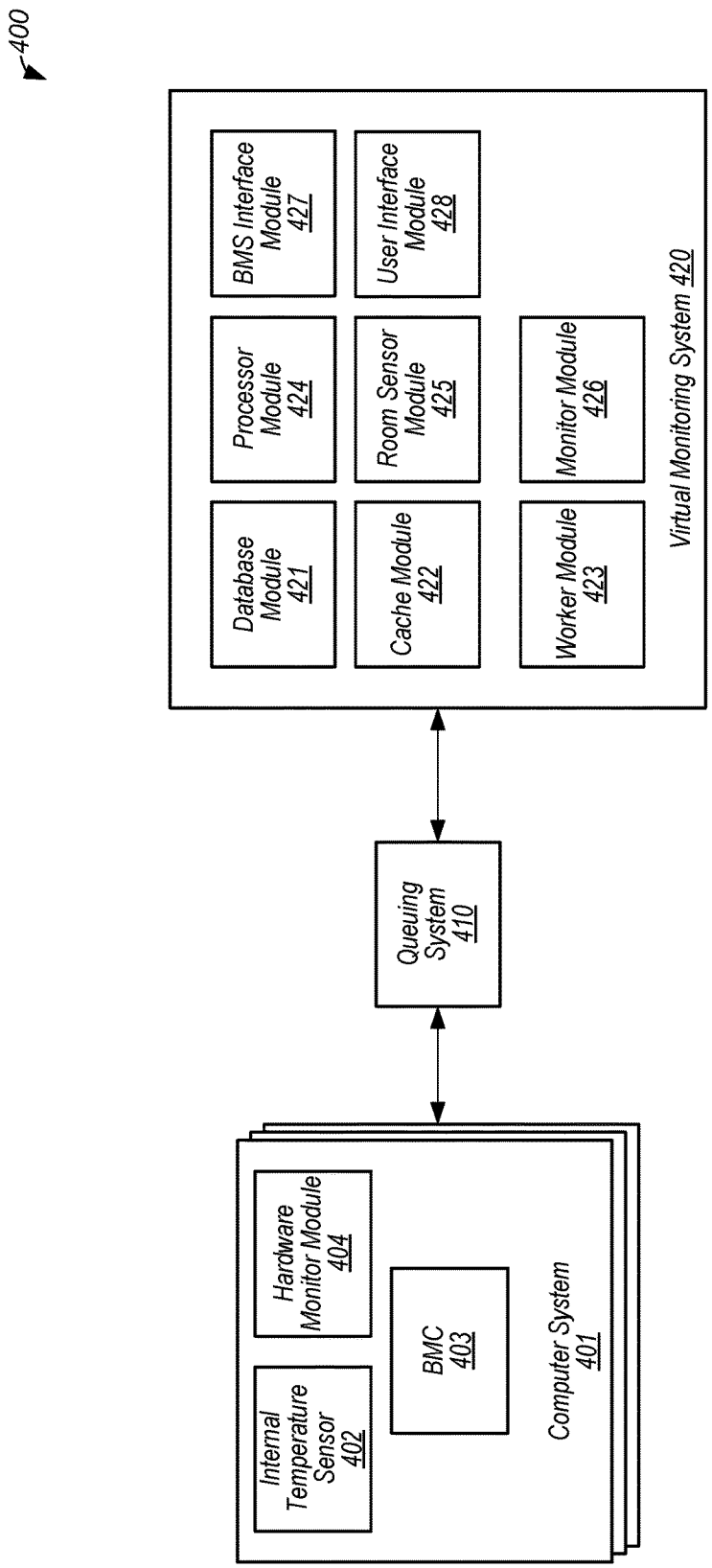
FIG. 4 is a schematic diagram illustrating a virtual monitoring system, according to some embodiments.

FIG. 4 is a schematic diagram illustrating a virtual monitoring system, according to some embodiments. In some embodiments, system 400 comprises the various components and systems illustrated and described above with reference to FIG. 1.

A system 400 can include various systems 401, 410, 420 which can include various modules that can at least partially enable virtual monitoring of various regions in a data center. Some or all of the modules described herein may be implemented by one or more components of one or more computer systems, discussed further below. Some modules can enable generation of one or more user interface representations of the various external environments. Some modules can enable control of one or more aspects of one or more data centers. In some embodiments, virtual monitoring system 400, which can be implemented partially or fully by one or more computer systems, includes modules that can enable virtual monitoring of various external environments in one or more data centers, including data centers remote from computer systems implementing at least a portion of the virtual monitoring system 400.

In some embodiments, system 400 includes a computer system 401 which itself includes at least an internal temperature sensor 402 and BMC 403. The computer system 401 can be implemented by one or more of the computer systems 105 illustrated and discussed above with reference to FIG. 1. Internal temperature sensor 402 can collect environmental measurements regarding an internal environment of the computer system 401. Computer system 401, in some embodiments, includes a hardware monitor module 404 that can access one or more internal temperature sensor measurements generated by sensor 402. Module 404 can be implemented by one or more portions of computer system 401. Module 404 may communicate with BMC 403 to receive the internal temperature sensor measurements of sensor 402. Module 404 may generate an output signal that includes the one or more internal temperature sensor measurements. In some embodiments, the output signals includes information identifying whether the internal temperature sensor measurements exceed one or more various thresholds associated with the computer system 401. The output signal may be generated in response to accessing a measurement, on a periodic time interval, etc.

In some embodiments, system 400 includes a queuing system 410 which receives output signals from module 404 and enables such output signals to be routed to one or more remote monitoring systems 420. In some embodiments, one or more remote monitoring systems 420 can access output signals from module 404 without communicating with queuing system 410.

Virtual monitoring system 420 can be implemented on one or more computer systems, including system 140 illustrated in FIG. 1. Virtual monitoring system 420 includes a database module 421, which can store various data associated with the virtual monitoring system. For example, database module 421 may store internal temperature sensor measurements received from hardware monitor modules 404 of one or more various computer systems 401. In addition, database module 421 can store information identifying various location information associated with the various computer systems 401 in one or more computer rooms in one or more data centers. Cache module 422 can receive the information identifying various location information associated with the various computer systems 401 in one or more computer rooms in one or more data centers and store such information in database module 421. Such location information can associate one or more various computer systems, including computer systems included in a set of computer systems, rack of computer systems, etc., with one or more particular regions of the data center, referred to hereinafter interchangeably as "zones" or "sections". Cache module 422 can receive the information via actively querying one or more various databases for the information, including remote databases, receiving such information on a predetermined time interval, intermittently, etc. In some embodiments, cache module 422 can receive and store, in database 421, information identifying one or more temperature offsets associated with one or more particular computer systems 401. The offsets may be determined locally or remotely.

Worker module 423 receives internal temperature measurements via output signals from module 404. In some embodiments, including the illustrated embodiment, module 423 receives the output signals from queuing system 410. Worker module 423 can process signals from the queuing system 410 to identify the internal temperature sensor measurement data and store the data in database 421. Worker may identify the particular computer system 402 associated with the data. In some embodiments, worker module 423 may append one or more sets of metadata to the data to associate it with a particular computer system 401, timestamp, etc.

In some embodiments, an offset is determined between an internal sensor temperature measurement associated with a computer system and an external environment corresponding to at least the computer system. In some embodiments, the offset is determined based at least in part upon tracking variations of the internal sensor temperature measurements with a temperature measurement of the external environment by a sensor device mounted in the external environment. Determining the offset, which can be referred to as a "calibration" process, can include, in some embodiments, regression analysis of the multiple internal sensor temperature measurements by one or more sensor devices in a computer system and external temperature measurements associated with a particular external environment to determine a relationship between the measurements. In some embodiments, at least some of the "calibration" process as described herein, including the described analysis of internal sensor temperature measurements and temperature measurements of the external environment over time to determine the relationship, is implemented at least in part by a calibration module included in a virtual monitoring system, which can include one or more of the virtual monitoring systems illustrated and discussed in at least FIGS. 1 and 4. In some embodiments, the offset can be determined for particular computer systems in one or more data centers. The derived offset can be assigned to one or more various computer systems in the data center, where internal sensor measurements from the various computer systems are processed using the assigned relationship. An offset may be assigned to a computer system based at least in part upon one or more characteristics of the computer system. For example, where an offset is derived for a particular computer system in a particular region of a particular data center, the offset may be assigned to other computer systems in one or more data centers, where the other computer systems are of a similar type of the particular computer system, where the other computer systems are installed the same region of the data center as the particular computer system, etc.

The offset can, in some embodiments, be specific to a particular computer system, where an offset is independently derived for each of the computer systems in one or more data centers, and each offset is assigned exclusively to the computer system for which the relationship is derived. In some embodiments, cache module 422 receives a predetermined offset from a remote source and assigns the offset to various computer systems 401, so that the offset is used as part of processing internal sensor measurements received from those various computer systems. The various computer systems may include particular computer systems 401 indicated in a received communication to be associated with the predetermined offset.

In some embodiments, virtual monitoring system 420 includes a processor module 424 that can derive a virtual sensor measurement of one or more environmental conditions of one or more various external environments corresponding to one or more particular computer systems. The module 424 can derive a virtual sensor measurement, including a virtual sensor temperature measurement, of a particular external environment based at least in part upon processing a received internal sensor measurement of at least a region of an internal environment of a particular computer system corresponding to the external environment. The module 424 can receive such received internal sensor measurements from database 421, at which the data may be stored by worker module 423. The module 424 can derive a virtual sensor measurement based at least in part upon processing a received internal sensor measurement with one or more offsets between the internal sensor measurement and the corresponding external environment. An offset associated with the computer system for which the internal temperature sensor measurement is generated can be received from database 421. In some embodiments, the offset is determined at processor module 424 based at least in part upon internal temperature sensor measurements received from computer system 401 and external temperature sensor measurements received from an external temperature sensor via a room sensor module 425. The offsets used to derive a particular virtual sensor measurement for an external environment corresponding to a computer system from which an internal sensor measurement is received can be used based at least in part upon identifying that the offsets are assigned to at least that particular computer system.

In some embodiments, virtual monitoring system 420 includes a room sensor module 425 that communicates with one or more remote systems to receive sensor measurements generated by one or more various external sensor devices installed in one or more data centers. For example, module 425 can be communicatively coupled to a BMS device of a data center and can receive sensor measurements received at the BMS from various external sensor devices installed in the data center and coupled to the BMS device. Such external sensor devices can include sensor devices that are external to computer systems in the data center and are mounted in various regions of the data center, which can include regions external to the external environments for which virtual sensor measurements are derived at module 424. For example, the BMS device may receive temperature measurements, relative humidity measurements, etc. from various external sensor devices associated with one or more regions in a data center, where the region encompasses at least some of the external environments, computer systems, etc. Where various computer systems, corresponding external environments, etc. are encompassed by the region, the sensor measurements from the various external sensor devices in the region can be associated with the various computer systems, external environments, etc. encompassed by the region. Module 425 may store received sensor measurements, including relative humidity measurements, external temperature sensor measurements, etc., in database 421.

In some embodiments, processor module 424 can process derived virtual sensor measurements with received external sensor measurements, which module 424 can access from database 421, to generate additional measurement data associated with one or more particular computer systems. For example, where received external sensor measurements include relative humidity measurements by a relative humidity sensor device in a data center region, which can include a cold aisle, that is associated with a particular computer system for which module 424 has derived a virtual external temperature sensor measurement, the module 424 can determine a heat index for the external environment. In some embodiments, derived virtual external temperature sensor measurements associated with multiple computer systems 401 are collectively used to determine a heat index value for one or more particular regions in a data center. For example, derived virtual external temperature sensor measurements associated with a set of multiple computer systems 401, including a set of computer systems installed in a rack 104, can be processed, and one or more of the minimum, maximum, and average derived temperatures from the multiple computer systems 401 can be determined. In some embodiments, module 424 processes one or more of the processed air temperatures for the multiple computer systems, including the maximum derived temperature measurement for the set of computer systems 401, with a received relative humidity measurement to determine a heat index value associated with the rack in which the computer systems are installed.

In some embodiments, processor module 424 processes derived measurements and determinations regarding one or more computer systems, external environments, etc. to generate one or more graphical representations of one or more regions of one or more data centers. The graphical representations, illustrated and discussed further below with reference to FIG. 5, can include a representation of various aisles, rows of racks, and computer systems installed therein, in one or more regions, rooms, etc. of one or more data centers. In some embodiments, the representations of one or more regions of a data center are referred to as "maps" of the regions. Various maps can be generated of the regions, including a map of temperatures in the regions, a map of temperature differentials representing air circulation in the regions, and a map of heat index values in the regions. Module 424 can store one or more generated maps in database 421, generate an output signal including the generated maps, etc.

In some embodiments, module 424 can update the representation based on analysis of derived measurements and determinations regarding such measurements. For example, module 424 can generate a graphical representation of a computer room that includes a row of racks with computer systems installed therein, where each computer system is highlighted a particular shade, color, etc. based at least in part upon the magnitude of a derived virtual external temperature sensor measurement of an external environment corresponding to that computer system. In some embodiments, module 424 can generate a graphical representation that highlights each computer system based at least in part upon a derived measurement, including virtual external temperature sensor measurements, derived heat index measurements, etc., that are within a range of values bounded by one or more threshold values, where the computer systems are highlighted a particular color, shade, etc. based upon which range of multiple ranges of values the measurement is presently within. In some embodiments, module 424 can generate a graphical representation that highlights each computer system based at least in part upon a derived history of variations of one or more derived measurements, including heat index, including highlighting each computer system a particular color, shade, etc. based on a number of times that one or more derived measurements are determined to be within one or more ranges of values within a particular period of time.

In some embodiments, processor module 424 processes derived virtual external temperature sensor measurements, heat index measurements, etc. of one or more external environments corresponding to one or more various computer systems to determine one or more operating states associated with the one or more external environments, the one or more corresponding computer systems, etc. Module 424 can compare derived virtual sensor measurements regarding temperatures, heat indices, etc. with one or more threshold values to determine a present operating state. For example, module 424 may access multiple sets of threshold temperature values, threshold heat index values, etc. that each define a range of values associated with a particular present operating state, where module 424 can determine which state of multiple states the air temperature for a give computer system is in based upon which range, of multiple ranges, of values the determined air temperature, heat index, etc. presently lies within. Various ranges can be associated with various present operating states, and various present operating states can be associated with various output signals. For example, present operating states can include a normal state associated with a range of temperature values, heat index values, etc., a critical state associated with another range of temperature values, heat index values, etc., that is above and adjacent to the normal state range, and a fatal state associated with another range of temperature values, heat index values, etc. that is above and adjacent to the critical state range. Where an air temperature, heat index value, etc. of a particular environment is determined to be within a range associated with a critical state, a warning output signal can be generated. Where an air temperature, heat index, etc. of a particular environment is determined to be within a range associated with a fatal state, another separate warning output signal can be generated. Separate ranges can be mutually exclusive. In some embodiments, separate ranges can at least partially overlap.

In some embodiments, module 424 analyzes virtual external sensor measurements continuously, intermittently, periodically, based at least in part upon receipt of internal sensor measurements, some combination thereof, or the like.

In some embodiments, processor module 424 monitors derived virtual external sensor measurements of various external environments to determine whether air is recirculating in one or more various regions of one or more various data centers. Module 424 can monitor one or more derived measurements associated with a set of external environments that collectively correspond to a set of computer systems, including computer systems mounted in a particular rack in a data center. In some embodiments, module 424 monitors multiple sets of computer systems, including multiple racks of computer systems in a data center. Module 424 can monitor a temperature difference between an identified highest derived measurement and a lowest derived measurement. For example, where a set of virtual external temperature sensor measurements are derived for each external environment corresponding a set of computer systems in a rack of multiple computer systems, module 424 can identify a present temperature measurement that is the highest temperature value of the set of temperature measurements, identify a present temperature measurement that is the lowest temperature value of the set of temperature measurements, and determine the present temperature difference between the present highest value and present lowest value. Where the value of the temperature difference is determined to exceed one or more threshold values, module 424 can determine that exhaust air is recirculating in a region that includes at least the set of computer systems.

In some embodiments, virtual monitoring system 420 include a monitor module 426 that monitors various computer systems, environments, etc. in one or more computer rooms of one or more data centers for indications of a data center event. An event may be determined at module 424 via determination that a derived measurement exceeds one or more thresholds. In some embodiments, an event is determined based upon processing output signals received from computer systems 401, where the output signals include indications that one or more internal measurements exceed one or more thresholds associated with the computer system. Monitor module 426 can respond to determining that an event has occurred by generating one or more output signals. Such output signals can include accessing an action request system to notify one or more operators of the occurrence of the event, request certain actions be taken, etc. Monitor module 426 may track an occurring event based on the type of the event, various thresholds exceeded, which may be interpreted as the severity of the event, etc. Where the type, severity, etc. of the event changes, monitor module 426 can update output signals accordingly, including changing an action requested.

In some embodiments, virtual monitoring system 420 includes a BMS interface module 427 that can interact with one or more external systems, including a BMS. Such interaction, in some embodiments, includes generating command signals that can be transmitted to one or more various external systems based at least in part upon analysis of environmental conditions at one or more regions of a data center. The command signals can include one or more commands to control one or more systems in a data center. The commands may be generated to adjust a present operating state of one or more external environments, computer systems, etc. in a data center, where the commands include one or more commands to control one or more systems that can, via operation, change the present operating state. For example, where a particular computer system in a data center is determined to be in a critical operating state based upon determining, via processing a derived virtual external sensor measurement of an external environment corresponding to that computer system, that the air temperature in the external environment exceeds a critical threshold, module 427 can generate a command signal based at least in part upon the determination. The command signal can include a command to control one or more aspects of an air handling system that supplies cooling air to at least the computer system, including one or more air cooling systems, air moving devices, etc. to reduce the air temperature of the cooling air at the external environment.

In some embodiments, the command signal is generated to be transmitted to a particular remote system. For example, module 427 can generate building management signals for transmission to one or more BMS devices, where a building management signal can be associated with a particular BMS device and can include a command to the BMS device to control one or more systems in a data center, including one or more air handling systems, air moving devices, air cooling systems, etc.

In some embodiments, module 427 provides information associated with various computer systems, sets of computer systems, etc. to an external system in response to a query from the external system. Such information may correspond to one or more query keys included in the query, which can identify particular regions of a data center, racks, sets of computer systems, etc. and can identify particular information being requested, including particular measurements associated with the identified regions, racks, sets, etc. For example, module 427 may receive a query from a BMS which identifies a particular "zone" or "section" of a particular computer room of a data center and may respond by generating an output signal which includes data, stored in database module 421, associated with some or all of the computer systems, sets of computer systems, etc. associated with that particular zone or section. Sets of computer systems associated with a zone or section can include sets of computer systems included in racks which are physically located in one or more particular regions of the data center associated with the particular zone or section. The data included in the output signal can include, for example, derived virtual external temperature sensor measurements associated with each of the sets of computer systems associated with the identified region, based at least in part upon the query including a query for such measurements associated with the identified region. In some embodiments, module 427 can generate an output signal which includes data associated with sets of computer systems in various regions of a data center, where the data is organized and into sets of data according to the various separate regions in which the sets of computers are located.

In some embodiments, virtual monitoring system 420 includes a user interface module 428 which accesses one or more generated maps and presents the one or more maps to a user via one or more display user interfaces. For example, module 428 can access a map, which was generated by module 424 and stored in database 421, based on a user-initiated command, and generate an output signal to present the map to remote end users via a display interface of remote computer systems supporting the users, via a communication network that communicatively couples the virtual monitoring system 420 and the remote computer systems.

In some embodiments, user interface module 428 presents historical variations in present operating states of one or more computer systems, sets of computer systems, etc. over one or more periods of time. Module 426 can present an indication of the number of times that a given computer system, set of computer systems, etc. is determined to be in one or more various present operating states in a period of time, which can include a rolling fixed period of time. In some embodiments, as discussed further below, a computer system that is in one or more particular operating states is referred to as being in an "excursion". For example, where a computer system is determined to be in a critical state, the computer system may be considered to in an "excursion" from the normal state.

Where the number of times, in a period of time, that one or more computer systems are determined to be in one or more particular present operating states at least meets a threshold number value, which can be referred to as a determined excursion history, module 424 can associate the one or more computers with an excursion history state corresponding to one or more computer systems. The excursion history state associated with a given computer system can be indicated in a graphical representation generated by module 424, where each one or more computer systems in the representation can be highlighted a particular color, shade, etc. that corresponds with a range of numbers of times, in a certain period of time, that the one or more computer systems have been in an excursion. For example, where a computer system is determined to have been in a critical present operating state, based at least in part upon analysis of derived heat index values of an external environment corresponding to the computer system, at least a certain number of times in a 24-hour period, module 424 may assign the computer system with an excursion history state identifying the computer system as frequently exiting the normal state. Such identification can enable data center operators to identify the computer system as a potential target for inspection, maintenance, replacement, etc.

FIG. 5A-F illustrate graphical representations that can be displayed via a user interface display, according to some embodiments. In some embodiments, the graphical representation can be generated by one or more modules of virtual monitoring system 400, including processor module 424, as illustrated and described above with reference to FIG. 4. The graphical representations can be presented to one or more users, including remote users, via one or more computer system display interfaces, by one or more modules of virtual monitoring system 420, including user interface module 428, as illustrated and described above with reference to FIG. 4.

Figure 5A:
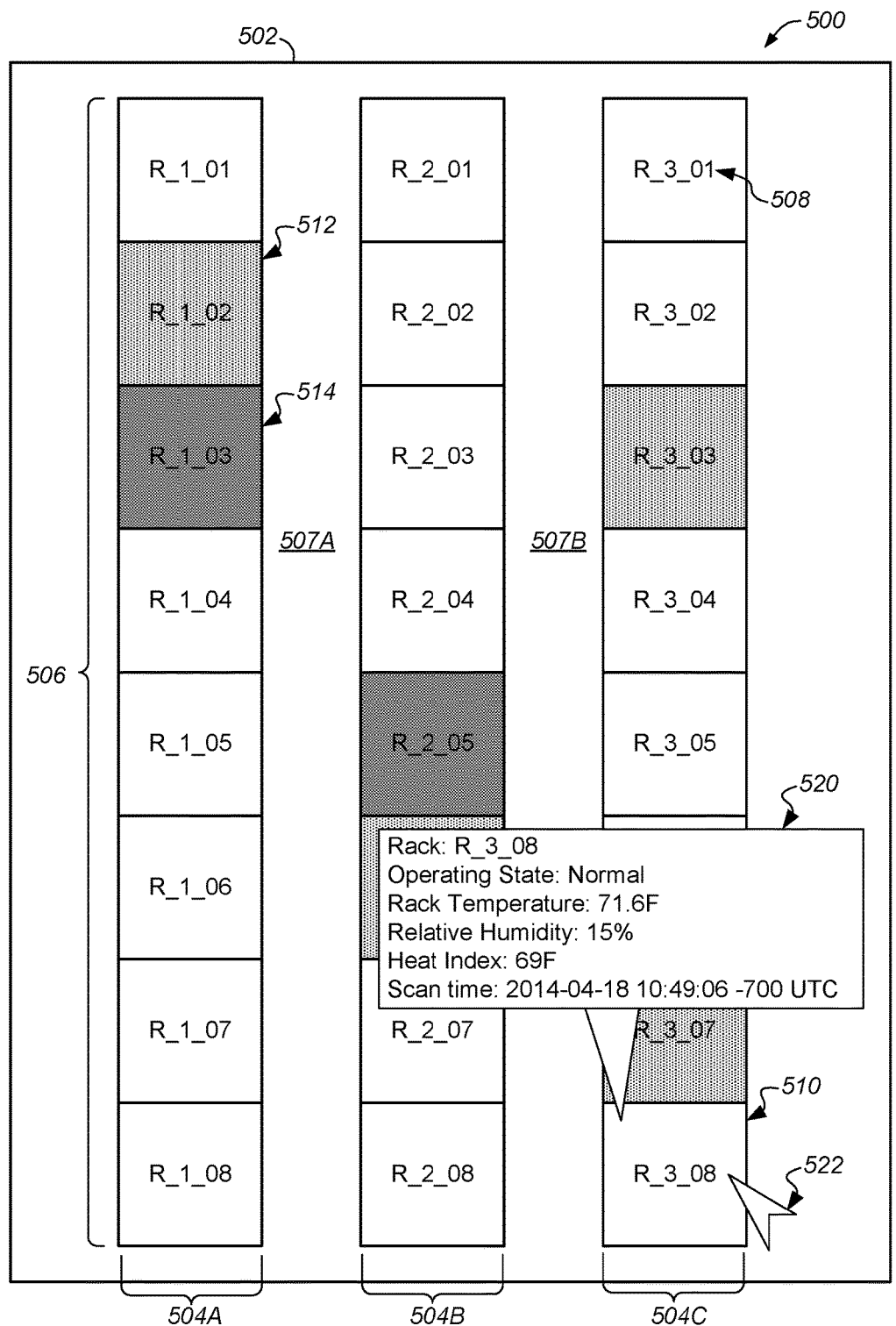
FIG. 5A-F illustrate graphical representations that can be displayed via a user interface display, according to some embodiments.

FIG. 5A illustrates a graphical representation of a region of a data center that can be displayed via a user interface, according to some embodiments. Display user interface 500, which can be presented to one or more users via a display interface of one or more computer systems supporting the one or more users, can include a graphical representation display 502 that includes graphical representations of various elements of a data center. In some embodiments, the graphical representation display 502 can be referred to as a "map" of one or more regions of a computer room, where the representation includes a representation of the arrangement of computer systems, racks, etc. in the computer room. For example, the illustrated display 502 includes a representation of a computer room that includes three rows 504A-C of racks 506, where each represented rack can correspond to an actual rack in the computer room, and where each rack can include one or more sets of installed computer systems, where a "set" of computer systems can include one computer system, some or all computer systems installed in a rack, etc. In addition, the illustrated display 502 includes representations of aisles 507A-B along the rows of racks, where the represented aisles 507A-B can correspond to actual aisles in the computer room. Each representation of a rack 506 includes a representation of a rack identifier 508, which can include an identifier which distinguishes the rack in the data center. In some embodiments, an aisle 507 is a cold aisle from which cooling air is supplied to each rack 506 in the illustrated racks 504A-B. In some embodiments, an aisle 507 is a hot aisle to which exhaust air is supplied from each computer system 506 in the illustrated racks.

In some embodiments, the display 502 highlights the various racks 506 illustrated in the graphical representation with particular highlightings that are associated with virtual monitoring of various external environments corresponding to the racks, as illustrated and discussed above with reference to FIG. 1-4. For example, in the illustrated embodiment, the display 502 includes graphical representations of some racks, including rack 510, which has a particular highlighting, some racks, including rack 512, which have another separate particular highlighting, and some racks, including rack 514, which have yet another separate particular highlighting. Each separate particular highlighting can, in some embodiments, correspond to a particular determined present operating state associated with the represented rack, the set of computer systems installed in the corresponding rack, etc.

In some embodiments, display 502 includes representations of racks that are each highlighted with one or more particular colors, shadings, illustrations, animation effects, etc. based at least in part upon analysis of a virtual external temperature sensor measurement of one or more external environments corresponding to one or more computer systems included in a set of computers installed in the respective racks. The derived temperature measurements can include minimums, maximums, averages, etc. of derived temperature measurements of a set of computer systems in a rack. The derived temperature measurements can be compared to multiple temperature ranges, and the rack corresponding to a set of computer systems can be highlighted a distinct highlighting based at least in part upon which temperature range includes the derived temperature measurement. Multiple racks may be independently highlighted with the same highlighting based upon each of the multiple racks corresponding to one or more derived virtual sensor temperature measurements, or processing thereof, that is determined to be within the same temperature range. Each temperature range may be associated with a separate present operating state, where a determination that a temperature measurement for a given external environment is within a particular temperature range includes a determination that the corresponding rack, set of computer systems installed in a rack, etc. is in presently in the associated present operating state. In some embodiments, measurements of a particular external environment corresponding to a particular set of computer systems may be compared with a particular set of temperature value ranges, based at least in part upon one or more characteristics of the particular set of computer systems, rack, etc. For example, one rack may be of a certain type that includes components, computer systems, etc. that can operate in a normal state at higher cooling air temperatures than other rack. As a result, that rack, set of computer systems, etc. may be associated with a particular set of temperature value ranges corresponding to that rack's type, so that the determined present operating state of that rack, determined based on the derived measurement of the corresponding external environment, corresponds to the characteristics of that computer system. The particular threshold values, ranges, etc. associated with a rack, set of computer systems, etc. can be received at a virtual monitoring system concurrently with internal temperature sensor measurements from computer systems in the rack, set, etc.

In some embodiments, display 502 includes representations of racks that are each highlighted with one or more particular colors, shadings, illustrations, animation effects, etc. based at least in part upon analysis of a virtual external sensor heat index measurement of one or more external environments corresponding to that rack. The heat index measurement can be derived based at least in part upon a processing of a derived virtual sensor temperature measurement of the external environment and a relative humidity measurement of one or more external sensor devices. The heat index measurement can be compared to multiple ranges of heat index values, and the rack corresponding to that external environment can be highlighted a distinct highlighting based at least in part upon which heat index value range includes the derived heat index value measurement. Multiple racks may be independently highlighted with the same highlighting based upon each of the multiple racks corresponding to an external environment for which a derived virtual sensor heat index measurement is determined to be within the same heat index range. Each heat index range may be associated with a separate present operating state, where a determination that a heat index measurement for a given external environment is within a particular heat index range includes a determination that the corresponding rack is in presently in the associated present operating state. In some embodiments, measurements of a particular external environment corresponding to a particular rack may be compared with a particular set of heat index value ranges, based at least in part upon one or more characteristics of the particular rack. For example, one rack may be of a certain type that includes components, computer systems, etc. that can operate in a normal state at higher cooling air heat index values than other racks. As a result, that rack may be associated with a particular set of heat index value ranges corresponding to that rack's type, so that the determined present operating state of that rack, determined based on the derived measurement of the corresponding external environment, corresponds to the characteristics of that rack.

In the illustrated embodiment, for example, rack 510 is illustrated with a particular highlighting that corresponds to a normal operating state based at least in part upon a determination that heat index data corresponding to the set of computer systems installed in the rack 510 are within a heat index value range that corresponds to a normal operating state. The heat index data corresponding to the set of computer systems can include a minimum, maximum, average, etc. of multiple individual virtual external temperature sensor measurements determined for each of the set of computer systems and a relative humidity sensor measurement corresponding to a region of the computer room that includes rack 510. Rack 512 is illustrated with a separate particular highlighting that corresponds to a critical operating state based at least in part upon a determination that heat index data corresponding to the set of computer systems installed in the rack 512 are within a heat index value range that corresponds to a critical operating state. Rack 514 is illustrated with another particular highlighting that corresponds to a fatal operating state based at least in part upon a determination that heat index data corresponding to the set of computer systems installed in the rack 514 are within a heat index value range that corresponds to a fatal operating state.

In some embodiments, a display interface 502 presents additional information associated with a particular rack based at least in part upon certain user-initiated interaction with the representation of the rack. Such additional information can be associated with the particular highlighting of the rack. In the illustrated embodiment, for example, a user-controlled cursor icon 522 is positioned over the representation of rack "R_3_08" 510. Based at least in part upon the cursor 522 being positioned in proximity with the representation of the rack 510, a display window 520 is presented, where the display window provides various information regarding the represented rack, including the rack identifier, the present operating state of the rack, a temperature measurement, relative humidity, heat index value, etc. associated with the rack, and a timestamp associated with determining the above data. The various information can include results of processing multiple instances of data associated with the set of computer systems installed in the rack. For example, the provided rack temperature may be an average of the individual derived virtual external temperature sensor measurements corresponding to the separate computer systems installed in the rack.

In some embodiments, display 502 includes representations of racks that are each highlighted with one or more particular colors, shadings, illustrations, animation effects, etc. based at least in part upon analysis of a determined excursion history of one or more external environments corresponding to that rack. The excursion history can be derived based at least in part upon determining a number of times that one or more particular present operating states are associated with the particular rack within a certain period of time, which can include a rolling fixed period of time. In some embodiments, a rack that is determined to be in one or more present operating states is referred to hereinafter as being in an "excursion" during the duration that the rack is determined to be in the one or more present operating states. The number of times that a rack is in an excursion in a certain period of time, also referred to hereinafter as the "excursion value" of the rack, can be compared to multiple ranges of excursion values, and the rack corresponding to that external environment can be highlighted a distinct highlighting based at least in part upon which excursion value range includes the determined excursion value for that rack. Multiple racks may be independently highlighted with the same highlighting based upon each of the multiple computer systems corresponding to an external environment for which an excursion value is determined to be within the same range.

Figure 5B:
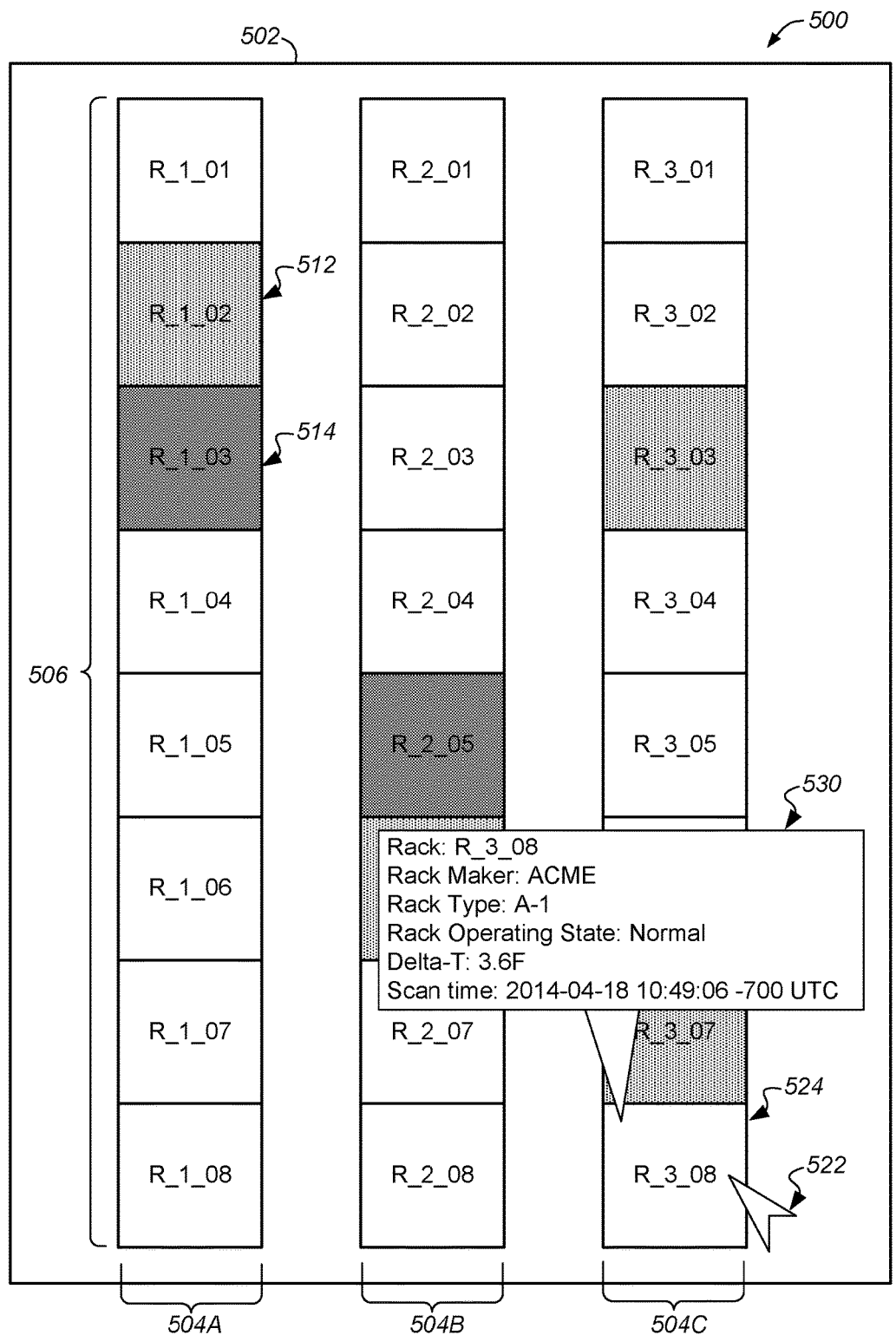

FIG. 5B illustrates a graphical representation of a region of a data center that can be displayed via a user interface, according to some embodiments. In some embodiments, a display can include a graphical representation associated with recirculation of exhaust air in one or more particular regions of a data center. For example, in the illustrated embodiment, the graphical representations of racks 506 includes particular highlightings of the racks that correspond with a determined temperature difference across the set of computer systems installed in a given rack, where the temperature difference, or "delta-T" can correspond to a determination of air recirculation in association with the given rack 506. As shown, rack 512 corresponds to a critical temperature difference, rack 514 corresponds to a fatal temperature difference, rack 510 corresponds to a normal temperature difference, and the racks are highlighted accordingly. In addition, where cursor 522 is positioned, based at least in part upon user interaction with a computer system displaying the display 502, in proximity with a rack, as shown with regard to rack 510, a display window 530 can be presented that provides information regarding the rack, including the rack identifier, the operating state of the rack, the delta-T, the rack maker and type, etc.

In some embodiments, display 502 is updated over time, and highlightings of racks illustrated in display 502 of FIG. 5A-B can change over time based at least in part upon updated received data. For example, where rack 514 is initially highlighted with a particular highlighting based on determining that the rack 514 is in a fatal state, based at least in part upon analysis of derived virtual external measurements of an external environment corresponding to computer systems installed in rack 514, and subsequent analysis of subsequently received sensor data results in a determination that the rack 514 is subsequently in another separate present operating state, including a normal state, display 502 can be updated so that rack 514 is changed from being highlighted with a highlighting associated with the critical state to being highlighted with a highlighting associated with the normal state.

In some embodiments, a user can interact with one or more representations in display 502 to receive additional information associated with a given rack, set of computers installed therein, etc. Such an interaction can include "clicking" on a representation of a rack.

Figure 5C:
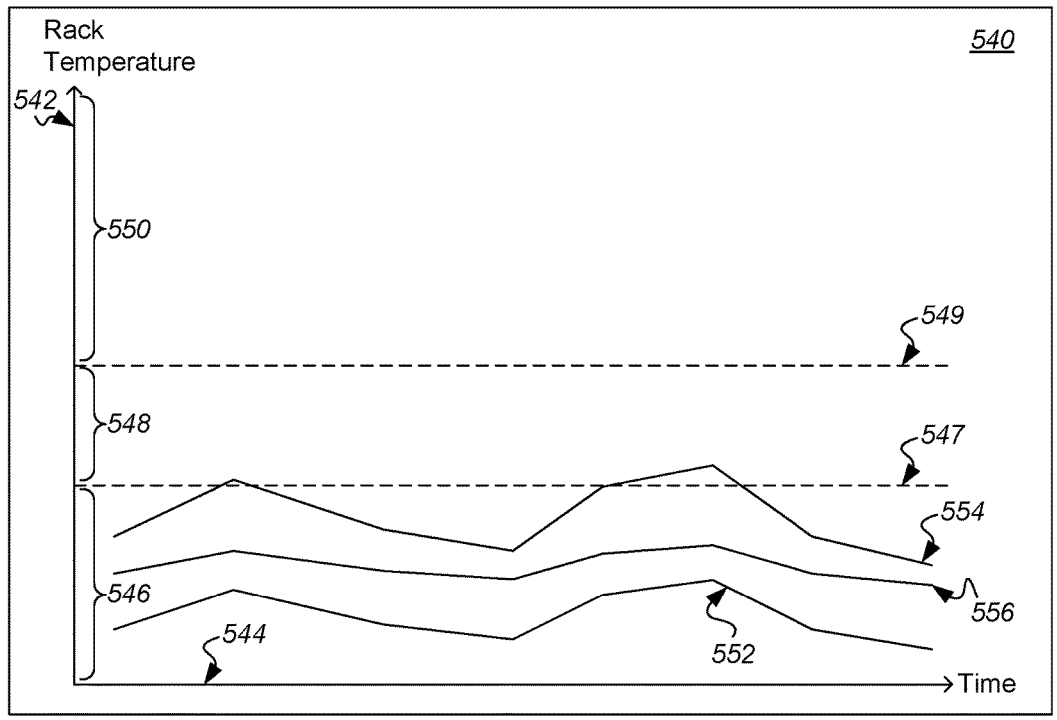

FIG. 5C illustrates a graphical representation of variation of temperature data associated with a given rack over time, according to some embodiments. The graphical representation may be presented for a given rack, including rack 510 illustrated in FIG. 5A-B, based at least in part upon a user positioning a cursor 522 in proximity with a representation of the rack 510 and "clicking" on the representation to select the rack 510. The illustrated graph of FIG. 5C shows variations of temperature data 542 associated with the rack over time 544. In some embodiments, a graph may show variations of other data associated with a rack, including heat index data, temperature differences, etc. The graph 540 may be presented, in some embodiments, by a module of the virtual monitoring system, including a user interface module.

The illustrated graph 540 illustrates various variations 552-556 of data associated with temperature data of the set of computers installed in a rack. The data can include, for example, a minimum derived virtual external temperature sensor measurements of the set of computer systems installed in the rack, a maximum measurement 554, an average measurement 556, etc. In some embodiments, one or more various variations of various data, including processed data associated with derived virtual measurements corresponding to one or more computer systems included in the rack can be displayed in the graph 540.

In some embodiments, a graphical representation of data variations over time includes representations of operating states associated with the varying data and indications of the variation of the operating state of the rack over time. In the illustrated embodiment, for example, graph 540 includes representations 546, 548, 550 associated with various temperature data ranges, established based on thresholds 547, 549, where the temperature data ranges can each correspond to a particular operating state. Range 546 may correspond with a normal operating state, range 548 may correspond to a critical operating state, and range 550 may correspond with a fatal operating state. As shown, the variations 552-556 of temperature data over time can show the various operating states that a rack may have been in over time, including showing that a maximum temperature measurement corresponding to the rack exceeded the threshold 547 between normal and critical operating states twice during the monitored period.

Figure 5D:
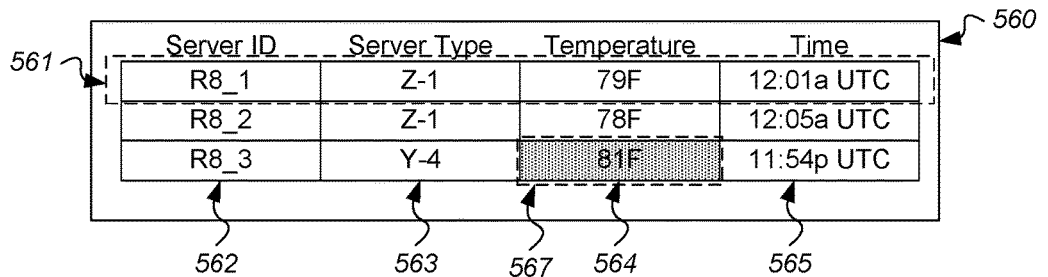

FIG. 5D illustrates a display window 560 which can be displayed to a user upon interacting with one or more portions of user interface 500. The display can show various derived virtual temperature sensor measurements associated with various computer systems installed in a given rack. The window 560 may be presented, in some embodiments, by a module of the virtual monitoring system, including a user interface module. The illustrated display window 560 can be displayed along with graph 540 illustrated in FIG. 5C, based at least in part upon a user selection of a particular rack. Window 560 includes multiple entries 561 associated with separate computer systems installed in the selected rack, where each entry includes an identifier 562 associated with a given computer system, an indicator 563 of a type associated with the computer system, a derived virtual external temperature sensor measurement 564 corresponding with that computer system, and timestamp 565 associated with the derivation. The window 560 can be updated over time based on subsequent derivations.

In some embodiments, the indicated derived virtual external temperature measurement 564 associated with a given entry 561 for a computer system is highlighted with a particular highlighting associated with the associated computer system. Such a highlighting can be based at least in part upon an operating state determined for the computer system, which can be based at least in part upon a determination that the derived temperature measurement exceeds one or more various thresholds. In the illustrated embodiment, for example, the derived virtual external temperature sensor measurement illustrated in window 567 associated with a certain computer system is highlighted with a highlighting that is associated with a determined operating state for that computer system, where the operating state can be determined based at least in part upon the temperature shown in entry 567 exceeding one or more threshold temperature values. Such a temperature in window 567 may be associated with a critical operating state, while other derived temperature measurements shown for other entries 561 are associated with other operating states and are therefore highlighted differently from window 567.

In some embodiments, a highlighting includes a "progress-bar" indication which partially highlights an element based at least in part upon one or more characteristics, operating states, etc. For example, in FIG. 5D, the derived temperatures measurements 564 can be highlighted by a progress bar highlighting which progressively highlights a given window, from one or more sides of the window, associated with a given measurement based at least in part upon the value of the derived measurement relative to various threshold values, operating states, etc. Where the derived measurement displayed in a window 567 for an entry 561 has a value which is within a range of temperature values associated with a normal operating state, the highlighting may fill a limited portion of the window 567 and may have a particular color associated with the operating state, such as the color green. As the derived measurement displayed in the window 567 increases, the "progress-bar" highlighting may progressively highlight more of the window 567. In addition, where the derived measurement is within another range of values associated with another operating state, the highlighting can change to another color, shade, etc. associated with that other operating state. For example, where the measurement in window 567 is within the temperature range associated with a critical operating state, the highlighting of window 567 may cover more than half of the window 567 and can have a particular color associated with that operating state, such as the color yellow.

Figure 5E:
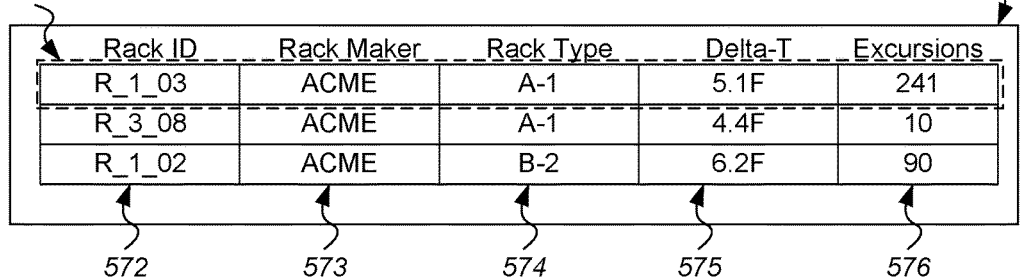

FIG. 5E illustrates a display window 570 which can be displayed to a user upon interacting with one or more portions of user interface 500. The display window 570 can show various derived characteristics associated with various racks in a data center. For example, the illustrated window 570 includes entries 571 associated with particular racks. Each entry 571 includes an indication of a rack identifier 572 associated with the rack, a rack maker 573 of the rack, a rack type 574 of the rack, a determined delta-T associated with the rack, and an excursion history 576 associated with the rack. In some embodiments, the excursion history indicates a number of excursions away from one or more particular operating states over a certain period of time, including the previous 24 hours.

Figure 5F:
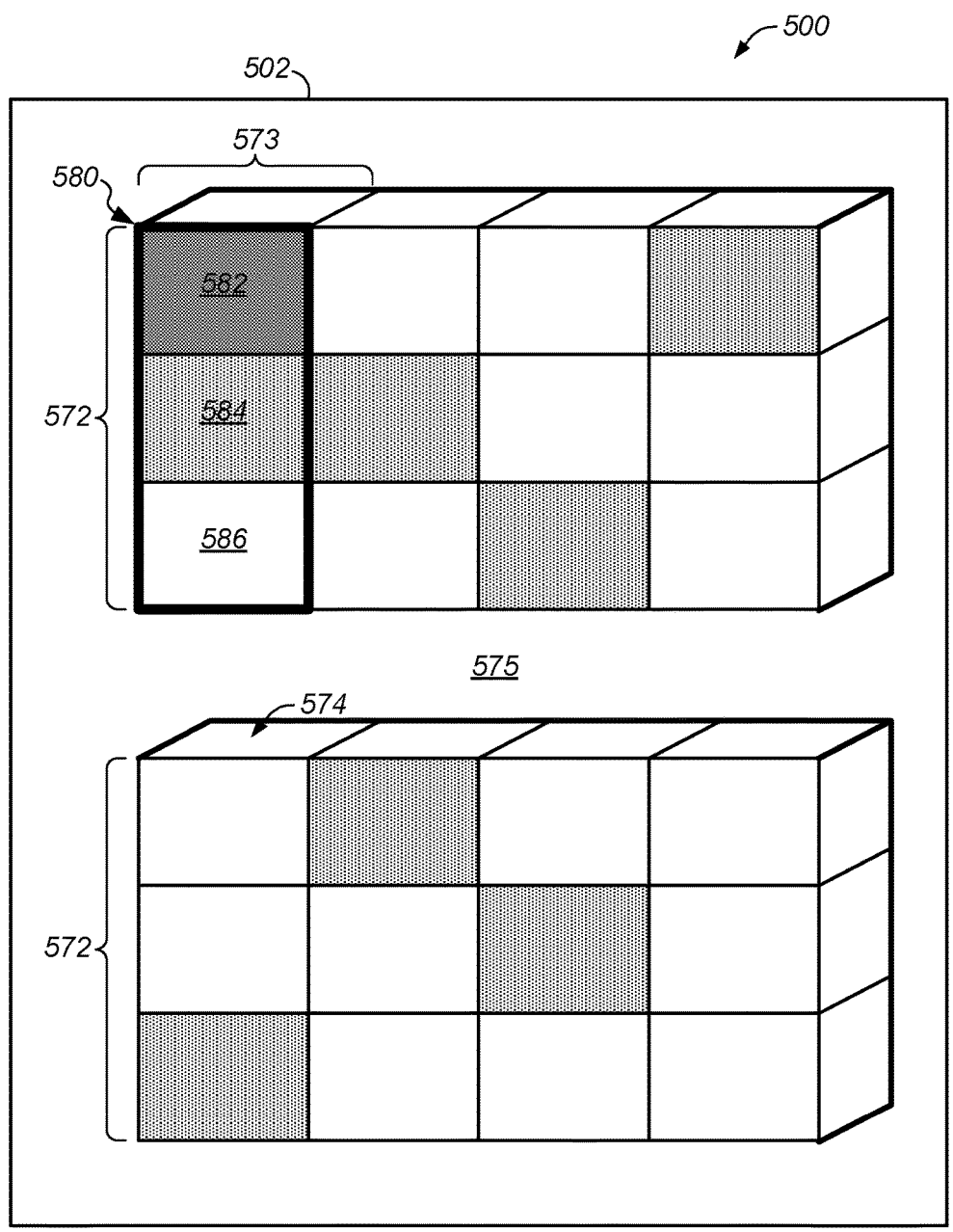

FIG. 5F illustrates a graphical representation of a region of a data center that can be displayed via a user interface, according to some embodiments. User interface 500, which can be presented to one or more users via a display interface of one or more computer systems supporting the one or more users, can include a graphical representation display 502 that includes representations of individual computer systems installed in various racks in a computer room of a data center. For example, the illustrated display 502 in FIG. 5F shows a representation of a computer room that includes two rows 574 of racks 573, each rack including installed computer systems 574, that are each adjacent to a common aisle space 575. In some embodiments, the aisle 575 is a cold aisle from which cooling air is supplied to each computer system 574 in the illustrated racks 573. In some embodiments, the aisle 575 is a hot aisle to which exhaust air is supplied from each computer system 574 in the illustrated racks.

In some embodiments, the display 502 highlights the various computer systems 574 illustrated in the graphical representation with particular highlightings that are associated with virtual monitoring of various external environments corresponding to the computer systems, as illustrated and discussed above with reference to FIG. 5A-B. For example, in the illustrated embodiment, the display 502 includes graphical representations of some computer systems, including computer system 582, which has a particular highlighting, some computer systems, including computer system 584, which have another separate particular highlighting, and some computer systems, including computer system 582, which have yet another separate particular highlighting. Each separate particular highlighting can, in some embodiments, correspond to a particular determined present operating state, derived virtual external temperature sensor measurement, etc. associated with the represented computer system.

In some embodiments, a display can include a graphical representation of recirculation of exhaust air in one or more particular regions of a data center. For example, in the illustrated embodiment, the graphical representation of rack 573 includes, in addition to highlightings of the separate computer systems 582-586 installed in the rack, an additional highlighting 580 that is presented based at least in part upon a determination of air recirculation in association with the rack 573. As shown, computer system 582 corresponds to a high virtual temperature measurement, and computer system 586 corresponds to a low virtual temperature measurement, and the computer systems are highlighted accordingly. Where the temperature difference between the derived measurements for computer systems 582 and 586 exceed a threshold, rack 573 is associated with a determination of air recirculation, and highlighting 580 is included in display 502 in association with rack 573.

In some embodiments, display 502 is updated over time, and highlightings of computer systems illustrated in display 502 can change over time based at least in part upon updated received data. For example, where computer system 584 is initially highlighted with a particular highlighting based on determining that the computer system 584 is in a critical state, based at least in part upon analysis of derived virtual external measurements of an external environment corresponding to computer system 584, and subsequent analysis of subsequently received sensor data results in a determination that the computer system 584 is subsequently in another separate present operating state, including a normal state, display 502 can be updated so that computer system 584 is changed from being highlighted with a highlighting associated with the critical state to being highlighted with a highlighting associated with the normal state.

Figure 6A:
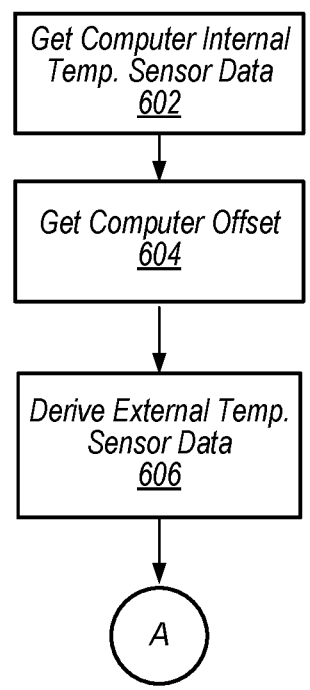
FIG. 6A-B illustrate deriving one or more virtual measurements of external environmental conditions, according to some embodiments.
Figure 6B:
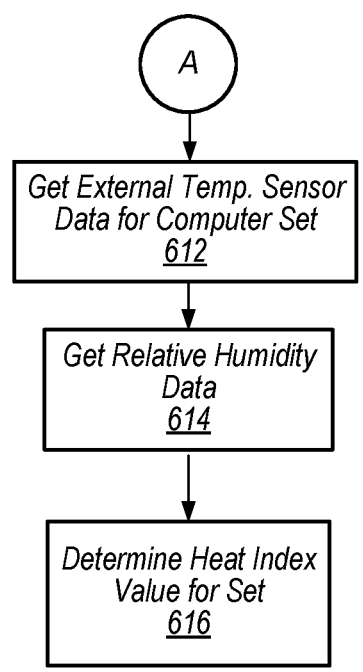

FIG. 6A-B illustrate deriving one or more virtual measurements of external environmental conditions, according to some embodiments. In some embodiments, the deriving is implemented at least in part at a virtual monitoring system that is at least partially implemented by one or more computer systems. In some embodiments, the monitoring is implemented, at least in part, by one or more modules of virtual monitoring system 420 illustrated and described above with reference to FIG. 4.

FIG. 6A illustrates deriving one or more virtual temperature measurements of an external environment corresponding to a computer system, based at least in part upon internal temperature sensor measurements received from the computer system. At 602, one or more instances of internal sensor temperature measurements associated with one or more internal environments of a computer system, also referred to hereinafter as instances of internal sensor data, is received. The internal sensor data can be received from one or more components in the computer system, including a BMC device that is coupled with one or more internal sensors. In some embodiments, the internal sensor data is received from a hardware monitoring module implemented by the computer system, from a queuing system, etc.

At 604, an offset associated with the computer system is received. In some embodiments the offset describes a virtual sensor measurement of temperature in an external environment as a function of the internal sensor measurement of temperature in the internal environment of the corresponding computer system. The offset may be retrieved from a local database. In some embodiments, the offset is received from a remote source. The offset may be assigned to one or more computer systems. In some embodiments, the offset is assigned exclusively to the computer system associated with the internal sensor. In some embodiments, the offset is assigned to other computer systems in one or more data centers based on one or more various factors, which can include being mounted in a common data center region of the computer system in which the internal sensor was included, being a computer system of a common type with the particular computer system, some combination thereof, or the like.

At 606, one or more instances of virtual external temperature sensor measurements, also referred to hereinafter as instances of virtual external sensor data, of one or more external environments are derived. The external environments can be external to and proximate to one or more of the one or more computer systems for which internal sensor data is received. An external environment that is external to, and proximate to, a given computer system can be referred to as corresponding to that computer system. Virtual external sensor data for a given external environment can be derived based at least in part upon received internal sensor data for a corresponding computer system and an offset, assigned to the computer system, between the internal sensor data and the corresponding external environment. The derived external temperature sensor data can be stored in a local database, indicated in a generated output signal, etc.

FIG. 6B illustrates deriving one or more Heat Index Values of an external environment corresponding to a set of one or more computer systems, based at least in part upon internal temperature sensor measurements received from the computer systems. The set of computer systems can correspond to a particular region of a data center, including the computer systems installed in a particular rack, aisle, etc. At 612, one or more instances of external temperature sensor data associated with each of the one or more computer systems in the set are received. The instances can be received from a local database.

At 614, relative humidity sensor measurements generated by one or more external sensors installed in a data center are received. The sensor measurements can be received via communication with a remote system, including a building management system (BMS) that is coupled with the external sensors. In the illustrated example, the sensor measurements include relative humidity data generated by one or more relative humidity sensors installed in a region of a data center.

At 616, one or more instances of virtual heat index value measurements, also referred to hereinafter as virtual heat index data, of one or more regions of a data center are derived. Virtual heat index data for a given region can be derived based at least in part upon the derived virtual external sensor data for the set of computer systems and at least some of the received relative humidity data. For example, received relative humidity data can be identified as being associated with one or more regions in one or more various data centers in which the set of computer systems are located. In some embodiments, the relative humidity data for the region can be processed with a processing of the external temperature sensor data for the set of computer systems to derive the heat index value for the region. The processing of the external temperature sensor data for the set of computers can include one or more of a minimum, average, maximum, etc. of the external temperature sensor measurements from each of the set of computer systems. The derived heat index value can be stored in a local database, indicated in a generated output signal, etc.

FIG. 7A-E illustrate monitoring external environmental conditions corresponding to various computer systems and generating graphical representations of the conditions, referred to hereinafter as "maps", according to some embodiments. In some embodiments, the monitoring is implemented at least in part at a virtual monitoring system that is at least partially implemented by one or more computer systems, as illustrated and described above with reference to at least FIGS. 1 and 4.

Figure 7A:
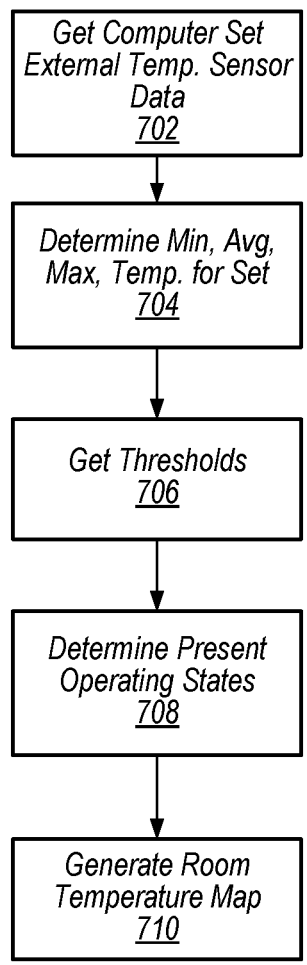
FIG. 7A-E illustrate monitoring external environmental conditions corresponding to various computer systems and generating graphical representations of the conditions, according to some embodiments.

FIG. 7A illustrates processing derived external temperature sensor data to determine temperature operating states of computer systems in a data center and generating a temperature map for a computer room of the data center.

At 702, one or more instances of derived virtual external temperature sensor measurements associated with a set of one or more computer systems, also referred to hereinafter as instances of virtual external sensor data, are received. At 704, the virtual external sensor data is processed to determine various statistical conditions of the virtual sensor data associated with the set of computer systems. Where the virtual external sensor data includes multiple instances of sensor data, the processing can include determining one or more of a minimum derived external virtual temperature sensor measurement corresponding to the set of computers, a maximum value, an average value, etc.

At 706, one or more thresholds associated with sensor data are received. Various thresholds can be associated with a range of sensor data values, and the ranges can be associated with various present operating states of the computer systems. For example, present operating states can include a normal state associated with a range of temperature values, a critical state associated with another range of temperature values that is above and adjacent to the normal state range, and a fatal state associated with another range of temperature values that is above and adjacent to the critical state range. Each range can be determined based at least in part upon high-value thresholds associated with a certain state and low-value thresholds associated with a certain state. Where a derived sensor data associated with an air temperature of a particular environment is determined to be within a range associated with a particular present operating state, the corresponding computer system can be determined to be in the present operating state. Separate ranges can be mutually exclusive. In some embodiments, separate ranges can at least partially overlap.

At 708, processed virtual sensor data, including one or more of maximum temperature measurements, minimum temperature measurements, average temperature measurements, etc. corresponding to the set of computer systems can be compared with ranges of sensor data values determined based on thresholds to determine a present operating state of corresponding computer systems. The determination can include determining that one or more instances of derived virtual sensor data have one or more values included within a particular range of values associated with a particular operating state. In some embodiments, the determination includes comparing virtual external sensor data from each individual computer system with the thresholds to determine a present operating state of each individual computer system.

At 710, a graphical representation, or "map" of at least a region of a data center is generated, where the map includes graphical representations of various sets of computer systems installed in the region that are each highlighted with one or more particular colors, shadings, illustrations, animation effects, etc. based at least in part upon the operating states of the sets of computer systems determined based on temperature data. Each set of computer systems may include a rack of computer systems, and the map may illustrate a graphical representation of the racks in a computer room, where each rack is highlighted based on a determined present operating state for the set of computer systems installed in the rack. Multiple sets of computer systems may be independently highlighted with the same highlighting based upon each set of computer systems corresponding to an external environment for which a derived virtual sensor temperature measurement is determined to be within the same temperature range.

Figure 7B:
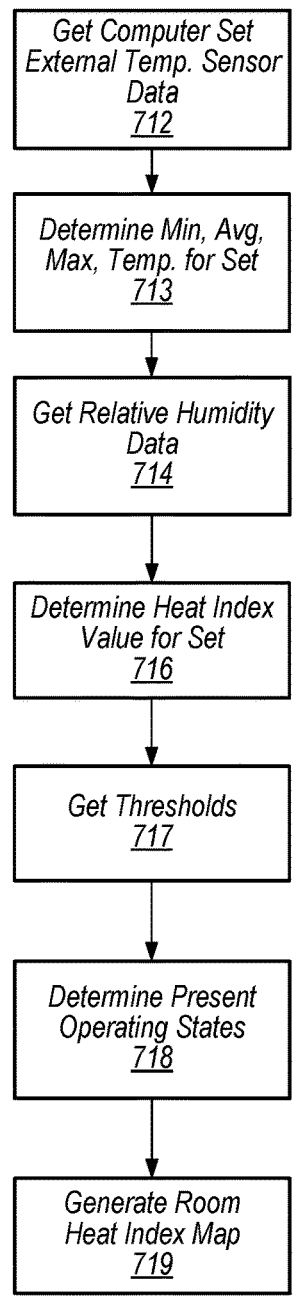

FIG. 7B illustrates processing derived external temperature sensor data to determine heat index operating states of computer systems in a data center and generating a heat index map for a computer room of the data center.

At 712, one or more instances of derived virtual external temperature sensor measurements associated with a set of one or more computer systems, also referred to hereinafter as instances of virtual external sensor data, are received. At 713, the external temperature sensor data for the set of computers, which can include multiple instances of derived virtual external temperature sensor measurements that each correspond to a separate computer system in the set, can be processed to determine various temperature data points, including minimum temperature measurements associated with the set, maximum temperature measurements, average temperature measurements, etc. At 714, relative humidity sensor data generated by one or more external sensors installed in a data center are received. The sensor data can be received via communication with a remote system, including a building management system (BMS) that is coupled with the external sensors. In the illustrated example, the sensor data includes relative humidity data generated by one or more relative humidity sensors installed in a region of a data center.

At 716, one or more instances of virtual heat index value measurements, also referred to hereinafter as virtual heat index data, corresponding to each set of computer systems are derived. Virtual heat index data for a given set of computer systems, which can include a virtual heat index value for a rack in which the set of computer systems are installed, can be derived based at least in part upon the derived virtual external sensor data for the set of computer systems and at least some of the received relative humidity data. For example, received relative humidity data can be identified as being associated with one or more regions in one or more various data centers in which the set of computer systems are located. In some embodiments, the relative humidity data for the region can be processed with a processing of the external temperature sensor data for the set of computer systems to derive the heat index value for the region. For example, a heat index value for a set of computers can be determined based on the received relative humidity value for the set and a determined average temperature measurement corresponding to the set. The derived heat index value can be stored in a local database, indicated in a generated output signal, etc.

At 717, one or more thresholds associated with sensor data are received. Various thresholds can be associated with a range of sensor data values, and the ranges can be associated with various present operating states of the computer systems. For example, present operating states can include a normal state associated with a range of heat index values, a critical state associated with another range of heat index values that is above and adjacent to the normal state range, and a fatal state associated with another range of heat index values that is above and adjacent to the critical state range. Each range can be determined based at least in part upon high-value thresholds associated with a certain state and low-value thresholds associated with a certain state. Where a derived sensor data associated with an air temperature of a particular environment is determined to be within a range associated with a particular present operating state, the corresponding computer system can be determined to be in the present operating state. Separate ranges can be mutually exclusive. In some embodiments, separate ranges can at least partially overlap.

At 718, the determined heat index value corresponding to the set of computer systems can be compared with ranges of sensor data values determined based on thresholds to determine a present operating state of corresponding set of computer systems. The determination can include determining that one or more instances of derived virtual sensor data have one or more values included within a particular range of values associated with a particular operating state. In some embodiments, the determination includes comparing virtual external sensor data from each individual computer system with the thresholds to determine a present operating state of each individual computer system.

At 719, a graphical representation, or "map" of at least a region of a data center is generated, where the map includes graphical representations of the various sets of computer systems installed in the region that are each highlighted with one or more particular colors, shadings, illustrations, animation effects, etc. based at least in part upon the derived virtual heat index data corresponding to the sets of computer systems. Each set of computer systems may include a rack of computer systems, and the map may illustrate a graphical representation of the racks in a computer room, where each rack is highlighted based on a determined present operating state, heat index value, etc. for the set of computer systems installed in the rack. The derived heat index value measurement for a given set of computer systems can be compared to multiple heat index ranges, and the set of computer systems corresponding to that external environment, including a rack, can be highlighted a distinct highlighting based at least in part upon which heat index range includes the derived heat index measurement. Multiple sets of computer systems may be independently highlighted with the same highlighting based upon each of the multiple computer systems corresponding to an external environment for which a derived virtual sensor heat index measurement is determined to be within the same heat index range.

Figure 7C:
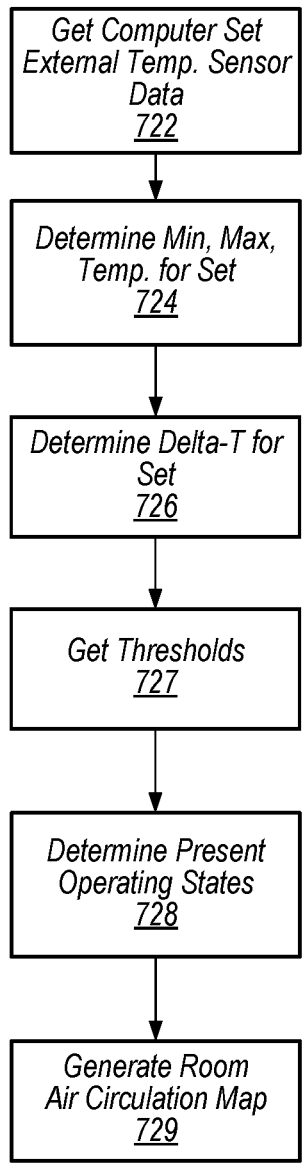

FIG. 7C illustrates processing derived external temperature sensor data to determine recirculation operating states of computer systems in a data center and generating an air circulation map for a computer room of the data center.

At 722, one or more instances of derived virtual external temperature sensor measurements associated with a set of one or more computer systems, also referred to hereinafter as instances of virtual external sensor data, are received.

At 724, extreme instances of the derived virtual external temperature sensor measurements in the instances associated with the set are determined. In particular, a maximum measurement and a minimum measurement are determined. In some embodiments, one or more of a minimum or maximum measurement is identified based on processing of the one or more instances of derived measurements, which can include discarding certain instances from being determined as an extreme instance.

At 726, a temperature differential across the set of computer systems, also referred to hereinafter as a "delta-T", is determined. The temperature differential can include a temperature difference between the derived virtual external sensor data of one of the set of computer systems that has the greatest value of any of the other derived virtual external sensor data corresponding to any of the set of computer systems, also referred to herein as the high sensor data, and the derived virtual external sensor data of one of the set of computer systems that has the lowest value of any of the other derived virtual external sensor data corresponding to any of the set of computer systems, also referred to herein as the low sensor data. The temperature differential, in some embodiments, includes a temperature difference between the present high sensor data and low sensor data. In some embodiments, the temperature differential includes a temperature difference between separate average values, determined based on multiple instances of data corresponding to a predetermined period of time, of each of the high sensor data and the low sensor data. In some embodiments, where the temperature difference includes average values of high and low sensor data, the average of each of the high sensor data and low sensor data can include sensor data corresponding to multiple computer systems in the set of computer systems, where the computer system corresponding to a present high or low sensor data changes during the period of time.

At 727 one or more various delta-T threshold values are received. At 728, a determination of a present circulation operating state associated with a set of computers is made. The determination can be made based at least in part upon determining whether the value of a temperature differential determined for a set of computer systems exceeds one or more various delta-T threshold values. If a temperature differential is determined to exceed one or more threshold values, the set of computer systems can be associated with an occurrence of air recirculation. For example, a predetermined temperature difference threshold value may be associated with the occurrence of exhaust air recirculation through at least one of a set of computer systems, where a temperature differential determined for a set of computer systems that includes a temperature difference value that exceeds the threshold value is determined to be associated with an occurrence of exhaust air recirculation. The recirculation may be determined to be occurring in physical proximate to one or more computer systems of the set of computer systems. For example, the computer systems corresponding to the high sensor data used to determine a temperature difference value that exceeds a temperature difference threshold value may be identified as a candidate location of the occurrence of recirculation. In some embodiments, an alarm signal may be generated, where the alarm signal identifies the occurrence of recirculation and identifies at least the set of computers associated with the recirculation. The alarm signal can be transmitted to one or more operators associated with a data center, a building management system (BMS) associated with the data center, one or more remote computer systems, etc. In some embodiments, the alarm signal comprises a report message that is identifies a physical location of the set of computers in the data center. In some embodiments, the alarm signal identifies one or more particular computer systems as candidate locations of recirculation. The alarm signal can include a request to an operator to inspect the one or more computer systems in the set of computer systems, including the one or more particular computer systems, perform maintenance to rectify any observed recirculation, etc.

At 729, an air circulation "map" can be generated. The "map" can comprise a graphical representation of one or more regions of one or more data centers, including a graphical representation of a computer room, that illustrates one or more sets of computer systems installed in the regions and highlights each set of computer systems with a particular highlighting based at least in part upon the temperature differential determined with respect to that set of computer systems. The "map" can be presented to one or more users via one or more various display interfaces of one or more computer systems supporting the users. The "map" can be stored at a computer system and can be accessed by the users via one or more communication networks. The "map" can be updated over time based at least in part upon changes in the determined temperature differentials of various sets of computer systems.

Figure 7D:
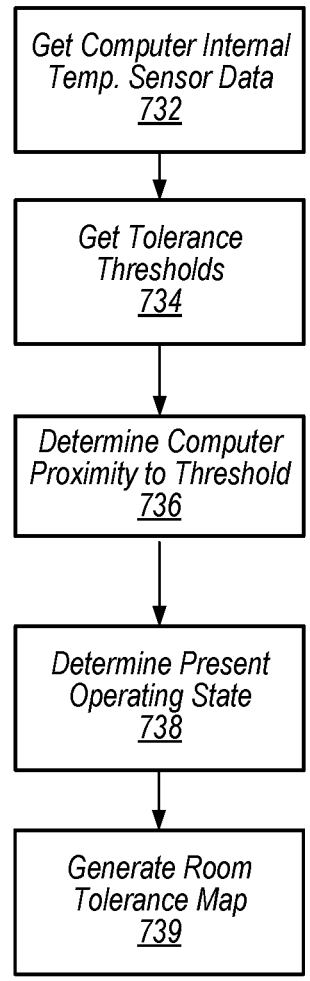

FIG. 7D illustrates processing received internal temperature sensor data to determine operating states of computer systems in a data center. At 732, one or more instances of internal temperature sensor measurements corresponding to one or more sets of computer systems, also referred to as internal temperature sensor data, is received. The internal temperature sensor data can be received from the set of computer systems, from a database, etc. At 734, one or more tolerance thresholds associated with the computer system are received. The tolerance thresholds can include threshold values for internal temperature sensor measurements that correspond to various operating states for the computer system. The tolerance thresholds can, in some embodiments, be associated with the particular "type", including manufacture, make and model, etc. of the particular computer systems, set of computer systems, etc. The tolerance thresholds can be received along with the internal temperature sensor data for the computer system. For example, internal temperature sensor measurements and tolerance thresholds may be received from a computer system concurrently may be stored in a concurrent set of data in a database, etc. In some embodiments, an operating state of a computer system is associated with a certain proximity of internal temperature sensor measurements of the computer system to one or more particular thresholds.

At 736, the computer system set's proximity to one or more of the thresholds is determined. The determination can include determining a proximity of a processing of various received internal temperature sensor data from the set of computer systems, including one or more of a minimum, maximum, average, etc., to one or more threshold values. At 738, a present operating state associated with the set of computer systems is determined. The present operating state can be determined based at least in part upon the internal temperature sensor measurements associated with the computer systems being within a particular proximity of one or more particular tolerance threshold values associated with the computer system. For example, where a received internal temperature sensor measurement for a computer system set exceeds a threshold temperature value by 5 degrees Fahrenheit, the computer system set may be determined to be in a critical operating state, and where the received internal temperature sensor measurement for the computer system is less than the threshold temperature value by 3 degrees Fahrenheit, the computer system set may be determined to be in a normal operating state.

At 739, a room tolerance "map" can be generated. The "map" can comprise a graphical representation of one or more regions of one or more data centers, including a graphical representation of a computer room, that illustrates one or more sets of computer systems installed in the regions and highlights each set of computer systems with a particular highlighting based at least in part upon the proximity of one or more computer systems in the set to one or more thresholds associated with the computer system. The "map" can be presented to one or more users via one or more various display interfaces of one or more computer systems supporting the users. The "map" can be stored at a computer system and can be accessed by the users via one or more communication networks. The "map" can be updated over time based at least in part upon changes in the determined proximities of internal temperature sensor measurements of various computer systems to associated thresholds.

Figure 7E:
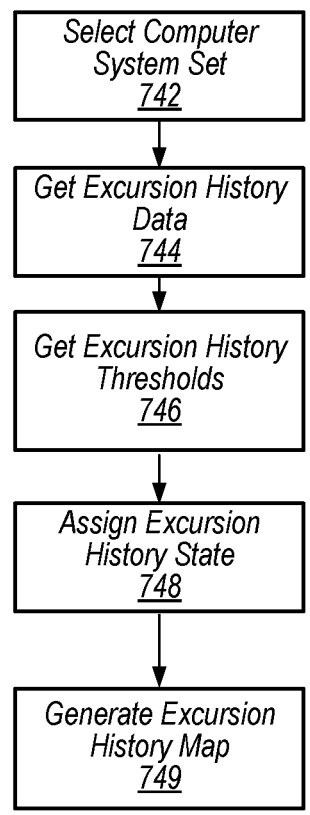

FIG. 7E illustrates monitoring derived external virtual sensor data of external environments for excursions of various environmental conditions beyond one or more thresholds.

At 742, one or more sets of computer systems are selected. The set of computer systems can include the computer systems installed in a particular rack in a data center. At 744, an excursion history associated with the one or more sets of computer systems is received. In some embodiments, and as indicated in the illustrated embodiment, where a computer system set is determined to be in some operating states, including states that are separate from a normal operating state, the computer system set can be determined to be in an operating state "excursion" from the normal operating state. An excursion history can include, for each of one or more computer systems, a historical list of entries that each correspond to a separate set of occurrences where the computer system is determined to be in an excursion. The set of occurrences can include a set of consecutive occurrences during which the computer system is determined to be in at least one particular present operating state associated with an excursion from a normal operating state. Each entry can be understood to correspond to a single occurrence of an excursion. The number of excursions associated with a computer system can be tracked over time. In some embodiments, the number of excursions in a rolling time period is tracked. For example, the number of excursions associated with a given computer system in the previous 24 hours may be tracked. In some embodiments, the cumulative amount of time in a certain time period during which a computer system is determined to be in an excursion may be tracked.

At 746, one or more excursion history thresholds are received. In some embodiments, an excursion threshold includes a predetermined number of excursions within a particular time period. The particular time period can include a rolling fixed period of time, including the previous 24 hours prior to the comparison. As an example, an excursion history threshold may comprise four excursions within the most recent 24 hours, where an excursion is determined to occur within the time period if any portion of the total duration of a given excursion occurs during the time period. In some embodiments, an excursion threshold includes a predetermined duration, within a particular time period, that the computer system was in one or more excursions. For example, a threshold may comprise a cumulative total time period of three hours, within the most recent 24 hours, during which a computer system was in one or more various excursions.

At 748, an excursion history state associated with the one or more computer system sets is determined based at least in part upon comparing the excursion history of the one or more computer systems and the received excursion history thresholds. If an excursion history of one or more computer system sets is determined to exceed at least one excursion history threshold, the one or more computer system sets are determined to be in one or more particular excursion history states. Excursion history indicators may be associated with a computer system based at least in part upon which thresholds are exceeded. For example, where a computer system has an excursion history that is determined to exceed a first threshold of two excursions within the last 24 hours, a "warning" excursion history state may be associated with the computer system. In addition, where the computer system has an excursion history that is determined to exceed another threshold, in addition or in alternative to the first threshold, of five excursions within the last 24 hours, a "critical" excursion history state may be associated with the computer system. The other state may be associated with the computer system in addition to, or in alternative to, the first state. For example, thresholds may have a particular priority level assigned to them, and a single excursion history state may be associated with one or more computer systems based at least in part upon the highest-priority threshold that is exceeded.

At 749, an excursion history "map" can be generated. The "map" can comprise a graphical representation of one or more regions of one or more data centers, including a graphical representation of a computer room, that illustrates various sets of computer systems, including various racks in which the sets of computer systems are installed, and highlights the sets of computer systems with a particular highlighting based at least in part upon the excursion history state associated with the set of computer systems. The "map" can be generated by one or more modules of the virtual monitoring system illustrated and discussed above with reference to FIG. 1-4, including the processor module of the virtual monitoring system. The "map" can be stored at a computer system, including a database of the virtual monitoring system, and can be accessed by the users via one or more communication networks. The "map" can be presented to one or more users via one or more various display interfaces of one or more computer systems supporting the users. The map may be presented to a user by one or more modules of the virtual monitoring system illustrated and discussed above with reference to FIG. 1-4, including the user interface module of the virtual monitoring system.

In some embodiments, a room map "animation" or "video" display can be generated. Such a video display can be generated by a processor module, including module 424 illustrated in FIG. 4, stored in a database, including module 421, and presented to a remote computer supporting a remote user via a user interface module, including module 428. Such a video display can comprise a sequence of visual frames, where each "frame" in the animation comprises a representation of a room "map" at a certain period in time, where the sequence of frames includes a sequence of maps each corresponding to different periods of time, or timestamps, arranged in a chronological order. The video display can indicate changes in operating states of various sets of computer systems in a room over time. For example, where a particular set of computer systems is in a particular operating state in an initial timestamp, another separate operating state in an adjacent subsequent timestamp, and in yet another separate operating state in a further adjacent subsequent timestamp, a video display of a room map which includes a representation of that computer system can show a highlighting of the representation changing as the animation progresses through the sequence of maps comprised therein as separate frames displayed in sequence according to corresponding timestamp. The video display can provide a "time-lapse" indication of variations in operating states of various sets of computer systems in a room over time.

Figure 8:
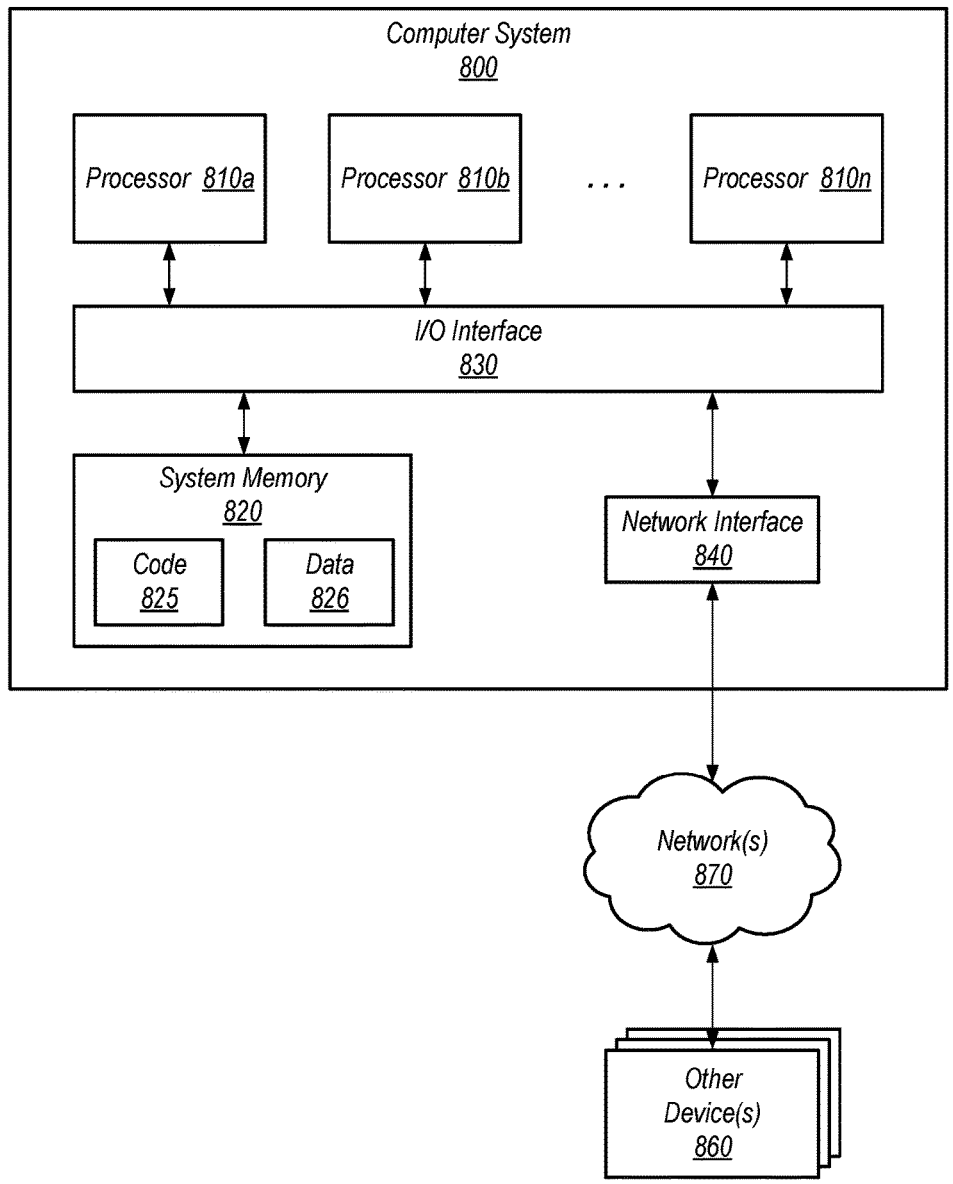
FIG. 8 is a block diagram illustrating an example computer system that may be used in some embodiments.

FIG. 8 is a block diagram illustrating an example computer system that may be used in some embodiments.

In some embodiments, a system that implements a portion or all of one or more of the technologies, including but not limited to one or more portions of the virtual temperature monitoring system, one or more components included in the one or more portions, and various airflow, temperature, and power management methods, systems, devices, and apparatuses as described herein, may include a general-purpose computer system that includes or is configured to access one or more computer-accessible media, such as computer system 800 illustrated in FIG. 8. In the illustrated embodiment, computer system 800 includes one or more processors 810 coupled to a system memory 820 via an input/output (I/O) interface 830. In some embodiments, computer system 800 further includes a network interface 840 coupled to I/O interface 830. In some embodiments, computer system 800 is independent of a network interface and can include a physical communication interface that can couple with a communication pathway, including a communication cable, power transmission line, etc. to couple with various external components, systems, etc.

In various embodiments, computer system 800 may be a uniprocessor system including one processor 810, or a multiprocessor system including several processors 810 (e.g., two, four, eight, or another suitable number). Processors 810 may be any suitable processors capable of executing instructions. For example, in various embodiments, processors 810 may be general-purpose or embedded processors implementing any of a variety of instruction set architectures (ISAs), such as the x86, PowerPC, SPARC, or MIPS ISAs, or any other suitable ISA. In multiprocessor systems, each of processors 810 may commonly, but not necessarily, implement the same ISA.

System memory 820 may be configured to store instructions and data accessible by processor(s) 810. In various embodiments, system memory 820 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as one or more portions of the virtual temperature monitoring system, one or more components included in the one or more portions, and various airflow, temperature, and power management methods, systems, devices, and apparatuses as described herein, are shown stored within system memory 820 as code 825 and data 826.

In one embodiment, I/O interface 830 may be configured to coordinate I/O traffic between processor 810, system memory 820, and any peripheral devices in the device, including network interface 840 or other peripheral interfaces. In some embodiments, I/O interface 830 may perform any necessary protocol, timing or other data transformations to convert data signals from one component (e.g., system memory 820) into a format suitable for use by another component (e.g., processor 810). In some embodiments, I/O interface 830 may include support for devices attached through various types of peripheral buses, such as a variant of the Peripheral Component Interconnect (PCI) bus standard or the Universal Serial Bus (USB) standard, for example. In some embodiments, the function of I/O interface 830 may be split into two or more separate components, such as a north bridge and a south bridge, for example. Also, in some embodiments some or all of the functionality of I/O interface 830, such as an interface to system memory 820, may be incorporated directly into processor 810.

Network interface 840 may be configured to allow data to be exchanged between computer system 800 and other devices 860 attached to a network or networks 850, such as other computer systems or devices as illustrated in FIGS. 1 through 7, for example. In various embodiments, network interface 840 may support communication via any suitable wired or wireless general data networks, such as types of Ethernet network, for example. Additionally, network interface 840 may support communication via telecommunications/telephony networks such as analog voice networks or digital fiber communications networks, via storage area networks such as Fibre Channel SANs, or via any other suitable type of network and/or protocol.

In some embodiments, system memory 820 may be one embodiment of a computer-accessible medium configured to store program instructions and data for implementing embodiments of virtual temperature management methods as described above relative to FIGS. 1-7. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 800 via I/O interface 830. A non-transitory computer-accessible storage medium, also referred to as a non-transitory computer-readable storage medium, may also include any volatile or non-volatile media such as RAM (e.g. SDRAM, DDR SDRAM, RDRAM, SRAM, etc.), ROM, etc., that may be included in some embodiments of computer system 800 as system memory 820 or another type of memory. Further, a computer-accessible medium may include transmission media or signals such as electrical, electromagnetic, or digital signals, conveyed via a communication medium such as a network and/or a wireless link, such as may be implemented via network interface 840.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A system, comprising:
one or more processors; and
memory storing program instructions that when executed by the one or more processors cause the one or more processors to:
  perform a calibration process, wherein to perform the calibration process the program instructions when executed by the one or more processors cause the one or more processors to:
    track variations, over a common period of time, of both internal temperature sensor measurements generated by an internal temperature sensor of a computer system, and external temperature sensor measurements generated by an external temperature sensor mounted in an external environment proximate to the computer system;
    derive a relationship between an internal temperature of the computer system and the external environment based at least in part upon the tracked variations;
  subsequent to the calibration process, assign the derived relationship to one or more computer systems; and
  for at least one of the one or more computer systems:
    communicate with the at least one computer system to receive an internal temperature sensor measurement, generated by an internal sensor of the at least one computer system, indicating an internal temperature of the at least one computer system; and derive a virtual external temperature sensor measurement of an external temperature of an environment external to the at least one computer system, based at least in part upon the received internal temperature sensor measurement and the derived relationship.

2. The system of claim 1, wherein the program instructions, when executed by the one or more processors further cause the one or more processors to:

determine a present operating state associated with the at least one computer system, based at least in part upon the derived virtual external temperature sensor measurement and at least one predetermined threshold value.

3. The system of claim 2, wherein:

the processor module is further configured to generate a graphical representation of the at least one computer system based at least in part upon the determined present operating state associated with the at least one computer system.

4. The system of claim 3, wherein:

the graphical representation of the at least one computer system comprises a video display, wherein:
 the video display comprises a sequence of frames that correspond to various different timestamps, and
 the sequence of frames of the video display is arranged in a chronological order based at least in part upon the timestamps corresponding to the frames, such that the video display is a graphical representation of the at least one computer system over a particular period of time.

5. The system of claim 1, wherein the program instructions, when executed by the one or more processors further cause the one or more processors to:

derive external virtual temperature sensor measurements for a plurality of external environments based at least in part upon received respective internal temperature sensor measurements of corresponding computer systems and the derived relationship, wherein different ones of the external virtual temperature sensor measurements correspond to different respective computer systems of a plurality of computer systems mounted in a common rack;

determine a temperature difference between a largest external virtual temperature sensor measurement and a smallest external virtual temperature sensor measurement for the plurality of external environments; and determine that exhaust air is being recirculated to at least one of the plurality of computer systems mounted in the common rack, based at least in part upon a determination that the temperature difference exceeds at least one predetermined threshold temperature difference value.

6. The system of claim 1, wherein:

the one or more processors are to receive a relative humidity sensor measurement of the external environment proximate to the at least one computer system; and the program instructions further comprise instructions that, when executed by the one or more processors cause the one or more processors to:

derive a virtual heat index measurement indicating a heat index of the external environment proximate to the at least one computer system based at least in part upon the derived external virtual temperature sensor measurement and the relative humidity sensor measurement; and determine that the heat index value of the derived virtual heat index measurement exceeds a predetermined heat index threshold value.

7. The system of claim 1, wherein the program instructions, when executed by the one or more processors further cause the one or more processors to:

derive a plurality of virtual external temperature sensor measurements of external temperatures of a plurality of environments external to a corresponding one of a plurality of computer systems installed in a rack, based at least in part upon corresponding received internal temperature sensor measurements from respective ones of the computer systems, and upon the derived relationship between the internal temperature and the external environment; and determine a present operating state associated with the rack, based at least in part upon the plurality of virtual external temperature sensor measurements and a predetermined threshold value.

8. A method, comprising:

performing a calibration process comprising:
 tracking variations, over a common period of time, of both internal temperature sensor measurements generated by an internal temperature sensor of a computer system, and external temperature sensor measurements generated by an external temperature sensor mounted in an external environment proximate to the computer system;
 deriving a relationship between an internal temperature of the computer system and the external environment based at least in part upon the tracked variations;
subsequent to the calibration process, assigning the derived relationship to one or more computer systems; and
for at least one of the one or more computer systems:
 communicating with the at least one computer system to receive an internal temperature sensor measurement generated by an internal sensor of the at least one computer system, indicating an internal temperature of the at least one computer system; and
 deriving a virtual external temperature sensor measurement of an external temperature of an environment external to the at least one computer system, based at least in part upon the received internal temperature sensor measurement and the derived relationship.

9. The method of claim 8, further comprising:

determining a present operating state associated with the at least one computer system, based at least in part upon the derived virtual external temperature sensor measurement and a predetermined threshold value.

10. The method of claim 9, further comprising:

generating a graphical representation of the at least one computer system based at least in part upon the determined present operating state associated with the at least one computer system.

11. The method of claim 8, further comprising:

determining corresponding external virtual temperature sensor measurements for a plurality of external environments that correspond to respective computer systems of a plurality of computer systems mounted in a common rack, based at least in part upon respective received internal temperature sensor measurements and the derived relationship;

determining a temperature difference between a largest external virtual temperature sensor measurement and a smallest external virtual temperature sensor measurement for the plurality of external environments; and determining that exhaust air is being recirculated to at least one of the plurality of computer systems mounted in the common rack, based at least in part upon a determination that the temperature difference exceeds a predetermined threshold temperature difference value.

12. The method of claim 8, further comprising:

deriving a virtual heat index measurement indicating a heat index value of the external environment proximate to the at least one computer system based at least in part upon the external virtual temperature sensor measurement and a relative humidity sensor measurement of the external environment received from a device associated with the external environment; and determining that the heat index value of the derived virtual heat index measurement exceeds a predetermined heat index threshold value.

13. The method of claim 12, further comprising:

responsive to determining that the heat index value exceeds the predetermined heat index threshold value, generating an output signal indicating that the heat index threshold value is exceeded.

14. A non-transitory computer readable medium storing a program of instructions that, when executed by a computer system, cause the computer system to:

perform a calibration process, wherein to perform the calibration process the program instructions when executed by the one or more processors cause the one or more processors to:

track variations, over a common period of time, of both internal temperature sensor measurements, generated by an internal temperature sensor of a computer system, and external temperature sensor measurements generated by an external temperature sensor mounted in an external environment proximate to the computer system;

derive a relationship between an internal temperature of the computer system and the external environment based at least in part upon the tracked variations;

subsequent to the calibration process, assign the derived relationship to one or more computer systems; and for at least one of the one or more computer systems:

communicate with the at least one computer system to receive an internal temperature sensor measurement, generated by an internal sensor of the at least one computer system, indicating an internal temperature of the at least one computer system; and derive a virtual external temperature sensor measurement of an external temperature of an environment external to the at least one computer system, based at least in part upon the received internal temperature sensor measurement and the derived relationship.

15. The non-transitory computer readable medium of claim 14, wherein the program of instructions, when executed by the computer system, cause the computer system to:

determine a present operating state associated with the at least one computer system, based at least in part upon the derived virtual external temperature sensor measurement and a predetermined threshold value.

16. The non-transitory computer readable medium of claim 15, wherein the program of instructions, when executed by the computer system, cause the computer system to:

derive a virtual heat index measurement indicating a heat index value of the external environment proximate to the at least one computer system based at least in part upon the external virtual temperature sensor measurement and a relative humidity sensor measurement of the external environment received from a device associated with the external environment; and determine the present operating state associated with the at least computer system based at least in part on a determination that the heat index value of the derived virtual heat index measurement exceeds a predetermined heat index threshold value.

17. The non-transitory computer readable medium of claim 16, wherein the program of instructions, when executed by the computer system, cause the computer system to:

responsive to the determination that the heat index value of the derived virtual heat index measurement exceeds the predetermined heat index threshold value, generate an associated output signal.

18. The non-transitory computer readable medium of claim 15, wherein the program of instructions, when executed by the computer system, cause the computer system to:

generate a graphical representation of the at least one computer system based at least in part upon the determined present operating state associated with the at least one computer system.

19. The non-transitory computer readable medium of claim 14, further comprising instructions to:

determine corresponding external virtual temperature sensor measurements for a plurality of external environments that correspond to respective computer systems of a plurality of computer systems mounted in a common rack, based at least in part upon received respective internal temperature sensor measurements and the derived relationship;

determine a temperature difference between a largest external virtual temperature sensor measurement and a smallest external virtual temperature sensor measurement for the plurality of external environments; and determine that exhaust air is being recirculated to at least one of the plurality of computer systems mounted in the common rack, based at least in part upon a determination that the temperature difference exceeds a predetermined threshold temperature difference value.

20. The non-transitory computer readable medium of claim 14, wherein the program of instructions, when executed by the computer system, cause the computer system to:

derive a plurality of virtual external temperature sensor measurements of external temperatures of a plurality of environments external to corresponding ones of a plurality of computer systems installed in a rack, based at least in part upon received respective internal temperature sensor measurements from corresponding computer systems and upon the derived relationship between the internal temperature and the external environment; and determining a present operating state associated with the rack, based at least in part upon the plurality of virtual external temperature sensor measurements and the predetermined threshold value.

* * * * *